(12) United States Patent
Haag et al.

(10) Patent No.: US 12,704,660 B2
(45) **Date of Patent: *Aug. 11, 2026**

(54) PARTIAL REFLECTOR HAVING STACK OF POLYMER LAYERS FOR CORRECTING COLOR SHIFT

(71) Applicant: 3M INNOVATIVE PROPERTIES COMPANY, St. Paul, MN (US)

(72) Inventors: Adam D. Haag, Woobury, MN (US); Sun-Yong Park, Gyeonggi-do (KR); Timothy J. Nevitt, Red Wing, MN (US); Brianna N. Wheeler, Bloomington, MN (US); Jody L. Peterson, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 534 days.

This patent is subject to a terminal disclaimer.

(21) Appl. No.: 18/337,722

(22) Filed: Jun. 20, 2023

(65) Prior Publication Data

US 2023/0333297 A1 Oct. 19, 2023

Related U.S. Application Data

(63) Continuation of application No. 16/647,707, filed as application No. PCT/IB2018/057624 on Oct. 2, 2018, now Pat. No. 11,726,245.

(Continued)

(51) Int. Cl.
*G02B 1/08* (2006.01)
*G02B 5/08* (2006.01)
(Continued)

(52) U.S. Cl.
CPC ............. *G02B 1/08* (2013.01); *G02B 5/3041* (2013.01); *G02B 5/305* (2013.01); *G02B 5/3083* (2013.01);
(Continued)

(58) Field of Classification Search
CPC ...... G02B 5/0841; G02B 5/287; G02B 5/305; G02F 1/133536; G02F 1/13362
See application file for complete search history.

(56) References Cited

U.S. PATENT DOCUMENTS 5,828,488 A 10/1998 Ouderkirk et al.
5,882,774 A 3/1999 Jonza et al.
(Continued)

FOREIGN PATENT DOCUMENTS

CN 101363929 A 2/2009
CN 102317820 A 1/2012
(Continued)

OTHER PUBLICATIONS

Denker, "Advanced Polarizer Film for Improved Performance of Liquid Crystal Displays," Society for Information Displays (SID) International Conference, SID International Symposium Digest of Technical Papers, 2006, vol. 37, No. 01, pp. 1528-1530.
(Continued)

*Primary Examiner* — Ryan S Dunning
(74) *Attorney, Agent, or Firm* — Theresa R. Stadheim

(57) ABSTRACT

A partial reflector including a plurality of optical repeat units where each optical repeat unit includes first and second polymer layers is described. A refractive index difference between the first and second polymer layers along a first axis may be $\Delta ny$, a refractive index difference between the first and second polymer layers along an orthogonal second axis may be $\Delta nx$, where $|\Delta nx|$ is at least 0.1 and $|\Delta ny|$ is no more than 0.04. The optical repeat units may have a smallest optical thickness T1 proximate a first side of the optical stack and a largest optical thickness T2 proximate an opposite second side of the optical stack, where (T2−T1)/(T2+T1) can be a range of 0.05 to 0.2, and T2 can be at least 350 nm and no more 1250 nm. The partial reflector may be used
(Continued)

in a circular polarizer for correcting color shift with view angle in a display.

18 Claims, 24 Drawing Sheets

Related U.S. Application Data

(60) Provisional application No. 62/566,654, filed on Oct. 2, 2017.

(51) Int. Cl.
*G02B 5/30* (2006.01)
*G02F 1/1335* (2006.01)
*G02F 1/13357* (2006.01)
*H10K 59/80* (2023.01)

(52) U.S. Cl.
CPC ... *G02F 1/133536* (2013.01); *H10K 59/8793* (2023.02); *G02B 5/0841* (2013.01); *G02F 1/13362* (2013.01)

(56) References Cited

U.S. PATENT DOCUMENTS

| | | | | |
|---|---|---|---|---|
| 6,157,490 | A | 12/2000 | Wheatley et al. | |
| 6,179,948 | B1 | 1/2001 | Merrill et al. | |
| 6,783,349 | B2 | 8/2004 | Neavin et al. | |
| 7,738,065 | B2 | 6/2010 | Shutou et al. | |
| 8,338,823 | B2 | 12/2012 | Kim et al. | |
| 8,691,351 | B2 | 4/2014 | Asakura et al. | |
| 9,110,245 | B2 | 8/2015 | Derks et al. | |
| 9,279,921 | B2 | 3/2016 | Kivel et al. | |
| 11,726,245 | B2 * | 8/2023 | Haag .................... | G02B 5/3083 359/201.2 |
| 2002/0141194 | A1 | 10/2002 | Wortman et al. | |
| 2004/0146663 | A1 | 7/2004 | Paukshto et al. | |
| 2005/0041292 | A1 | 2/2005 | Wheatley et al. | |
| 2006/0066511 | A1 | 3/2006 | Chui et al. | |
| 2009/0040440 | A1 | 2/2009 | Park | |
| 2010/0002296 | A1 | 1/2010 | Choi et al. | |
| 2011/0128477 | A1 | 6/2011 | Izaki et al. | |
| 2011/0249332 | A1 | 10/2011 | Merrill | |
| 2011/0272849 | A1 | 11/2011 | Neavin et al. | |
| 2014/0240829 | A1 | 8/2014 | Weber et al. | |
| 2016/0077266 | A1 | 3/2016 | Weber et al. | |
| 2016/0118448 | A1 | 4/2016 | Epstein et al. | |
| 2016/0245983 | A1 | 8/2016 | Lien et al. | |

FOREIGN PATENT DOCUMENTS

| | | | |
|---|---|---|---|
| CN | 102325830 | A | 1/2012 |
| CN | 102334050 | A | 1/2012 |
| CN | 105765425 | A | 7/2016 |
| CN | 106062597 | A | 10/2016 |
| JP | 2006512619 | A | 4/2006 |
| JP | 3996940 | B2 | 10/2007 |
| JP | H05-271575 | A | 10/2008 |
| JP | 2014052606 | A | 3/2014 |
| JP | 2016502741 | A | 1/2016 |
| KR | 20160026150 | A | 3/2016 |
| KR | 10-1633133 | B1 | 6/2016 |
| WO | 1999036258 | A1 | 7/1999 |
| WO | 2015035030 | A1 | 3/2015 |
| WO | 2016061192 | A1 | 4/2016 |
| WO | 2017213911 | A1 | 12/2017 |
| WO | 2018045070 | A1 | 3/2018 |
| WO | 2018052872 | A1 | 3/2018 |

OTHER PUBLICATIONS

International Search Report for PCT International Application No. PCT/IB2018/057624, mailed on Mar. 29, 2019, 5 pages.

* cited by examiner

PARTIAL REFLECTOR HAVING STACK OF POLYMER LAYERS FOR CORRECTING COLOR SHIFT

CROSS REFERENCE TO RELATED APPLICATIONS

This application is a continuation application of application Ser. No. 16/647,707 filed Mar. 16, 2020, which is a national stage filing under 35 U.S.C. 371 of PCT/IB2018/057624, filed Oct. 2, 2018, which claims the benefit of Provisional Application No. 62/566,654, filed Oct. 2, 2017, the disclosures of which are incorporated by reference in their entirety herein.

BACKGROUND

Reflective films including multiple polymeric layers are known. Examples of such films include mirrors and polarizers which include alternating polymeric layers in which the adjacent layers have different refractive indices.

Displays may exhibit a color shift with view angle.

SUMMARY

In some aspects of the present description, a wavelength and polarization dependent partial reflector including an optical stack is provided. The optical stack includes a plurality of optical repeat units where each optical repeat unit includes first and second polymer layers. For wavelengths $\lambda1<\lambda2<\lambda3$, the partial reflector has a transmittance for normally incident light polarized along a first axis of at least 85% for wavelengths between $\lambda1$ and $\lambda3$. The partial reflector has a first reflection band having band edges at $\lambda2$ and $\lambda3$ for normally incident light polarized along an orthogonal second axis. The partial reflector has an f-ratio of the optical repeat units, a refractive index difference between the first and second polymer layers along the second axis, and a total number of optical repeat units in the optical stack such that the first reflection band has an average reflectance for normally incident light polarized along the second axis between 15% and 97%. The optical repeat units have a range of optical thicknesses such that $(\lambda3-\lambda2)/(\lambda3+\lambda2)$ is in a range of 0.05 to 0.2, the first reflection band is a primary reflection band, and $\lambda3$ is at least 700 nm and no more than 2500 nm.

In some aspects of the present description, a wavelength and polarization dependent partial reflector comprising an optical stack is provided. The optical stack includes a plurality of optical repeat units, each optical repeat unit including first and second polymer layers, a refractive index difference between the first and second polymer layers along a first axis being $\Delta ny$, a refractive index difference between the first and second polymer layers along an orthogonal second axis being $\Delta nx$, $|\Delta nx|$ being at least 0.1 and $|\Delta ny|$ being no more than 0.04. For refractive indices along the second axis, the optical repeat units have a smallest optical thickness T1 proximate a first side of the optical stack and a largest optical thickness T2 proximate an opposite second side of the optical stack. $(T2-T1)/(T2+T1)$ is in a range of 0.05 to 0.2 where T2 being at least 350 nm and no more 1250 nm.

In some aspects of the present description, a circular polarizer including a linear absorbing polarizer, a retarder, and a reflective polarizer disposed between the linear absorbing polarizer and the retarder is provided. The reflective polarizer has a primary reflection band having a shorter wavelength band edge at a wavelength of at least 600 nm.

In some aspects of the present description, a circular polarizer including a linear absorbing polarizer, a retarder, and a reflective polarizer disposed between the linear absorbing polarizer and the retarder is provided. The reflective polarizer includes an optical stack including a plurality of optical repeat units where each optical repeat unit includes first and second polymer layers. A refractive index difference between the first and second polymer layers along a first axis is $\Delta ny$, a refractive index difference between the first and second polymer layers along an orthogonal second axis is $\Delta nx$ where $|\Delta nx|$ is at least 0.1 and $|\Delta ny|$ is no more than 0.04. For refractive indices along the second axis, the optical repeat units have a smallest optical thickness T1 proximate a first side of the optical stack and a largest optical thickness T2 proximate an opposite second side of the optical stack where T2 is at least 300 nm.

In some aspects of the present description, a display including an organic light emitting diode display panel and a circular polarizer disposed proximate the display panel is provided. The organic light emitting diode display panel has an emission spectra having first, second and third peak emission wavelengths $\lambda a$, $\lambda a$ and $\lambda b$ satisfying $\lambda a<\lambda b<\lambda c$. The circular polarizer includes a linear absorbing polarizer, a retarder disposed between the linear absorbing polarizer and the display panel, and a reflective polarizer disposed between the linear absorbing polarizer and the retarder. The reflective polarizer has a transmittance for normally incident light polarized along a pass axis of the reflective polarizer of at least of at least 85% for wavelengths between $\lambda a$ and $\lambda c$, and a transmittance for normally incident light polarized along a block axis of the reflective polarizer of at least of at least 85% for wavelengths between $\frac{1}{2}(\lambda a+\lambda b)$ and $\frac{1}{2}(\lambda b+\lambda c)$. For a wavelength $\lambda3>\lambda c$ and a wavelength $\lambda2$ satisfying $\frac{1}{2}(\lambda b+\lambda c)<\lambda2<\lambda3$, the reflective polarizer has a first reflection band having band edges at $\lambda2$ and $\lambda3$ for normally incident light polarized along the block axis. The first reflection band has an average reflectance for normally incident light polarized along the block axis between 15% and 97%.

In some aspects of the present description, a display including an organic light emitting diode display panel and a circular polarizer disposed proximate the display panel is provided. The organic light emitting diode display panel has an emission spectra having first, second and third peak emission wavelengths $\lambda a$, $\lambda a$ and $\lambda b$ satisfying $\lambda a<\lambda b<\lambda c$. The circular polarizer includes a linear absorbing polarizer, a retarder disposed between the linear absorbing polarizer and the display panel, and a reflective polarizer disposed between the linear absorbing polarizer and the retarder. The reflective polarizer has a transmittance for normally incident light polarized along a pass axis of the reflective polarizer of at least of at least 85% for wavelengths between $\lambda a$ and $\lambda c$, and a transmittance for normally incident light polarized along a block axis of the reflective polarizer of at least of at least 85% for wavelengths between $\frac{1}{2}(\lambda a+\lambda b)$ and $\frac{1}{2}(\lambda b+\lambda c)$. For a wavelength $\lambda3>\lambda c$ and a wavelength $\lambda2$ satisfying $\frac{1}{2}(\lambda b+\lambda c)<\lambda2<\lambda3$, the reflective polarizer has a primary reflection band having band edges at $\lambda2$ and $\lambda3$ for normally incident light polarized along the block axis.

In some aspects of the present description, a display including an organic light emitting diode display panel and a circular polarizer disposed proximate the display panel is provided. The circular polarizer includes a linear absorbing polarizer, a retarder disposed between the linear absorbing polarizer and the display panel, and a wavelength and polarization dependent partial reflector disposed between the linear absorbing polarizer and the retarder. The partial reflector is a color-correcting partial reflector such that the display has a Δu'v' color shift at a view angle of 45 degrees that is no more than 0.8 times that of an otherwise equivalent display having an otherwise equivalent circular polarizer not including the partial reflector.

BRIEF DESCRIPTION OF THE DRAWINGS

FIG. 13 is a schematic plot of a spectrum produced by a display as viewed normal to the display when the display is fully on;

DETAILED DESCRIPTION

Figure 1:
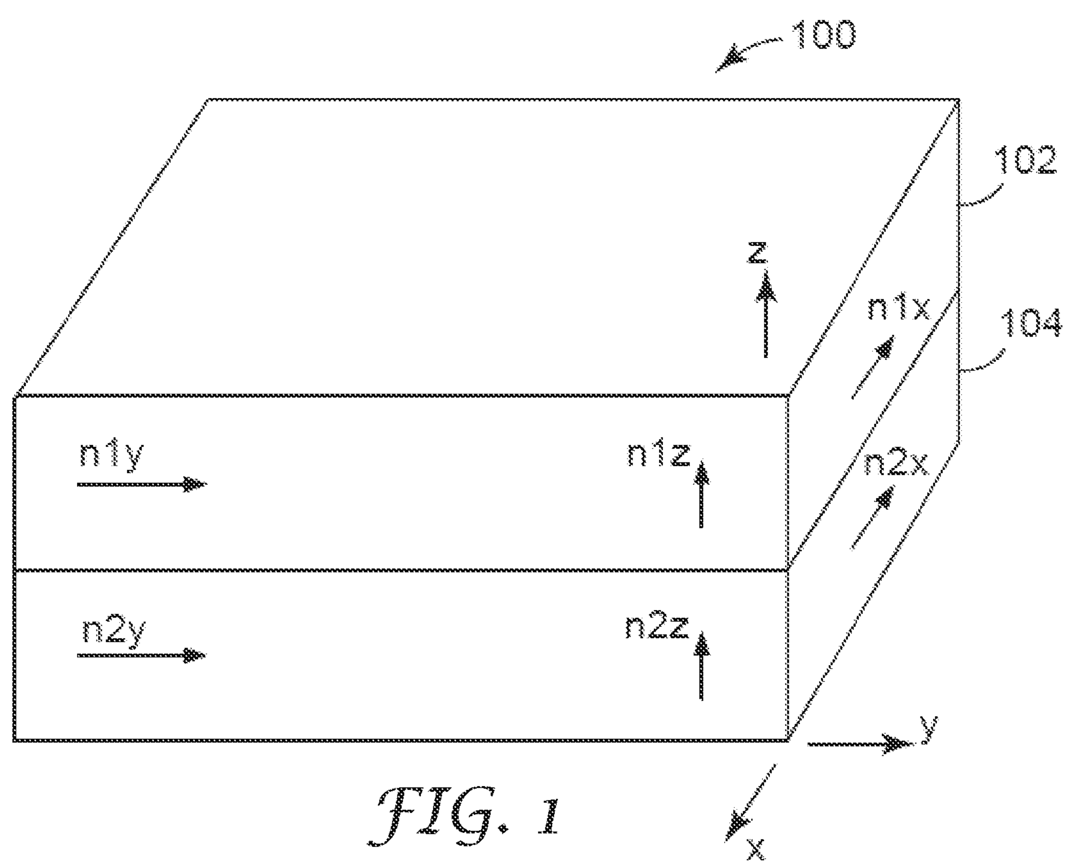
FIG. 1 is a schematic perspective view of an exemplary optical repeat unit of a multilayer optical film.

In the following description, reference is made to the accompanying drawings that form apart hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

Wavelength and polarization dependent partial reflectors according to some embodiments of the present description are useful for reducing the color shift with view angle of an organic light emitting diode (OLED) display when the partial reflector is used in a circular polarizer of the OLED display, for example. The partial reflectors may be referred to as reflective polarizers or as partial reflective polarizers since the partial reflectors, in some embodiments, have a reflection band for one polarization state and not for an orthogonal polarization state. The reflection band typically has an average reflectance for normally incident light polarized along a block axis less than 97%, or less than 95%, or less than 90%, or less than 75%, or less than 60%. The reflection band may be weaker than the reflection band of conventional multilayer optical film mirrors or reflective polarizers which typically provide an average reflectance of greater than 98%. The partial reflectors may be birefringent multilayer optical films with controlled band edges and tailored reflectivity with incidence angle. The partial reflectors may be designed to have minimal visual effects on axis when incorporated in a display but create optical gain for desired wavelengths off axis. It has been found that utilizing the partial reflectors of the present description in an OLED display can provide improved color uniformity with varying view angle by providing a wavelength and view angle dependent gain without sacrificing image quality despite the typically diffusive character of the backplane of the OLED display.

In some embodiments, the partial reflector is configured to negligibly affect light from an OLED display at normal incidence to the partial reflector, but provide a wavelength dependent gain at off-normal incidence by recycling a portion of light incident on the partial reflector at off-normal incidence. This can be achieved by choosing the reflection band to be predominately in the near-infrared (wavelengths from 700 nm to 2500 nm) at normal incidence. At off-normal view angles the reflection band is shifted into the red wavelength range (wavelengths from 600 nm to 700 nm) and this can provide a gain for red wavelengths that increases with increasing view angle. In some embodiments, the partial reflector may provide a wavelength dependent gain at normal incidence as well as providing a wavelength dependent gain at off-normal incidence (e.g., by including a second harmonic of a primary reflection band to recycle a portion of the blue light, for example). This can be done to allow additional flexibility in providing the desired light output from the display or to correct the color temperature of light output at normal incidence when the display is fully on, for example. The partial reflectors of the present description are also useful in other display applications and in non-display applications as described further elsewhere herein.

A wavelength and polarization dependent partial reflector or reflective polarizer of the present description is typically a multilayer optical film that includes an optical stack including a plurality of optical repeat units where each optical repeat unit includes first and second polymer layers. FIG. 1 is a schematic perspective view of an exemplary optical repeat unit (ORU) of a multilayer optical film 100. FIG. 1 depicts only two layers of the multilayer optical film 100, which can include tens or hundreds of such layers arranged in one or more contiguous packets or stacks. The film 100 includes individual microlayers 102, 104, where "microlayers" refer to layers that are sufficiently thin so that light reflected at a plurality of interfaces between such layers undergoes constructive or destructive interference to give the multilayer optical film the desired reflective or transmissive properties. The microlayers 102, 104 can together represent one optical repeat unit (ORU) of the multilayer stack, an ORU being the smallest set of layers that recur in a repeating pattern throughout the thickness of the stack. The microlayers have different refractive index characteristics so that some light is reflected at interfaces between adjacent microlayers. For optical films designed to reflect light at ultraviolet, visible, or near-infrared wavelengths, each microlayer typically has an optical thickness (i.e., a physical thickness multiplied by the relevant refractive index) of less than about 1 micrometer. Thicker layers can, however, also be included, such as skin layers at the outer surfaces of the film, or protective boundary layers (PBL) disposed within the film that separate packets of microlayers, as desired. In some embodiments, only a single packet or stack of microlayers is included in the optical films of the present description.

Refractive indices of one of the microlayers (e.g. microlayer 102 of FIG. 1, or the "A" layers of FIG. 2) for light polarized along principal x-, y-, and z-axes are n1x, n1y, and n1z, respectively. The mutually orthogonal x-, y-, and z-axes can, for example, correspond to the principal directions of the dielectric tensor of the material. In many embodiments, and for discussion purposes, the principle directions of the different materials are coincident, but this need not be the case in general. The refractive indices of the adjacent microlayer (e.g. microlayer 104 in FIG. 1, or the "B" layers in FIG. 2) along the same axes are n2x, n2y, n2z, respectively. The differences in refractive index between these layers are $\Delta nx$ (=n1x−n2x) along the x-direction, $\Delta ny$ (=n1y−n2y) along they-direction, and $\Delta nz$ (=n1z−n2z) along the z-direction. The nature of these refractive index differences, in combination with the number of microlayers in the film (or in a given stack of the film) and their thickness distribution, control the reflective and transmissive characteristics of the film (or of the given stack of the film). For example, if adjacent microlayers have a large refractive index mismatch along one in-plane direction ($\Delta nx$ large) and a small refractive index mismatch along the orthogonal in-plane direction ($\Delta ny \approx 0$), the film or packet may behave as a reflective polarizer for normally incident light. A reflective polarizer or polarization dependent partial reflector may be considered to be an optical body that relatively strongly transmits normally incident light that is polarized along one in-plane axis, which may be referred to as the pass axis or the first axis, and relatively strongly reflects normally incident light that is polarized along an orthogonal in-plane axis, which may be referred to as the block axis or the second axis, if the wavelength is within a reflection band of the reflective polarizer or polarization dependent partial reflector.

If desired, the refractive index difference ($\Delta nz$) between adjacent microlayers for light polarized along the z-axis can also be tailored to achieve desirable reflectivity properties for the p-polarization component of obliquely incident light. To maintain near on-axis reflectivity of p-polarized light at oblique angles of incidence, the z-index mismatch $\Delta nz$ between microlayers can be controlled to be substantially less than the maximum in-plane refractive index difference $\Delta nx$, such that $|\Delta nz| \leq 0.5^*|\Delta nx|$. Alternatively, $|\Delta nz| \leq 0.25^*|\Delta nx|$. A zero or near zero magnitude z-index mismatch yields interfaces between microlayers whose reflectivity for p-polarized light is constant or near constant as a function of incidence angle. Furthermore, the z-index mismatch $\Delta nz$ can be controlled to have the opposite polarity compared to the in-plane index difference $\Delta nx$, e.g., $\Delta nz<0$ when $\Delta nx>0$. This condition yields interfaces whose reflectivity for p-polarized light increases with increasing angles of incidence, as is the case for s-polarized light. If $\Delta nz>0$, then the reflectivity for p-polarized light decreases with angle of incidence. The foregoing relationships also of course apply to relationships involving $\Delta nz$ and $\Delta ny$, e.g., in cases where significant reflectivity and transmission are desired along two principal in-plane axes (such as a partial polarizing film whose pass axis has significant reflectivity at normal incidence).

Figure 2:
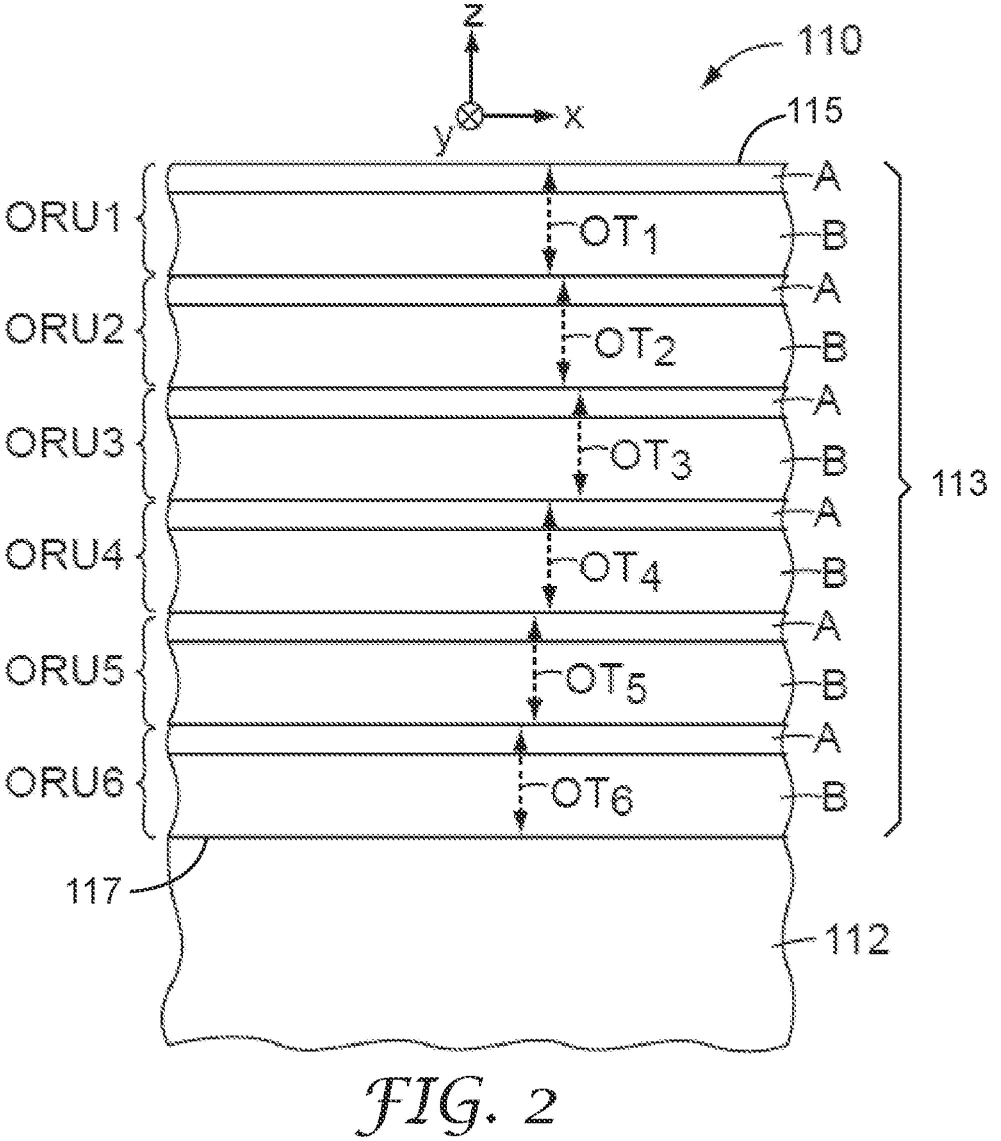
FIG. 2 is a schematic side view of a partial reflector.

In the schematic side view of FIG. 2, more interior layers of a multilayer optical film 110 are shown so that multiple ORUs can be seen. The film is shown in relation to a local x-y-z Cartesian coordinate system, where the film extends parallel to the x- and y-axes, and the z-axis is perpendicular to the film and its constituent layers and parallel to a thickness axis of the film.

In FIG. 2, the microlayers are labeled "A" or "B." the "A" layers being composed of one material and the "B" layers being composed of a different material, these layers being stacked in an alternating arrangement to form optical repeat units or unit cells ORU 1, ORU 2, . . . ORU 6 as shown. In many embodiments, a multilayer optical film composed entirely of polymeric materials would include many more than 6 optical repeat units if high reflectivities are desired. The multilayer optical film 110 is shown as having a substantially thicker layer 112, which may represent an outer skin layer, or a protective boundary layer ("PBL," see U.S. Pat. No. 6,783,349 (Neavin et al.)) that may separate the stack of microlayers shown in the figure from another stack or packet of microlayers (if present). Multilayer optical film 110 includes a single stack 113 having opposing first and second sides 115 and 117.

In some embodiments, the thicker layer 112 is optically thick in that it is too thick to significantly contribute to the constructive and destructive interference provided by the optical stack. In some embodiments, an optically thick layer has at least one of a physical thickness and an optical thickness that is at least 1 micrometer, or at least 2 micrometers, or at least 3 micrometers, or at least 5 micrometers. In some embodiments, a circular polarizer used in an OLED display includes a partial reflector of the present description disposed between a linear absorbing polarizer and a retarder for improved color uniformity with view angle when the display is fully on.

In some cases, the microlayers of a given stack or packet can have thicknesses and refractive index values corresponding to a ¼-wave stack, i.e., arranged in ORUs each having two adjacent microlayers of equal optical thickness, such ORU being effective to reflect by constructive interference light whose wavelength λ is twice the overall optical thickness of the optical repeat unit. The "optical thickness" of a body refers to its physical thickness multiplied by its refractive index. In the case of a polarization dependent partial reflector, the refractive index used in determining the optical thickness is the refractive index along the axis of the partial reflector where the reflection band reflects more strongly (e.g., the block axis of a reflective polarizer). A ¼-wave stack, in which the two adjacent microlayers in each ORU have equal optical thickness, is said to have an "f-ratio" of 0.5 or 50%. "F-ratio" in this regard refers to the ratio of the optical thickness of a constituent layer "A" to the optical thickness of the complete optical repeat unit, where the constituent layer "A" is assumed to have a higher refractive index than the constituent layer "B"; if the layer "B" has the higher refractive index, then the f-ratio is the ratio of the optical thickness of the constituent layer "B" to the optical thickness of the complete optical repeat unit. The use of a 50% f-ratio is often considered desirable because it maximizes the reflective power of the $1^{st}$ order (primary) reflection band of a stack of microlayers. However, a 50% f-ratio suppresses or eliminates the $2^{nd}$ order (second harmonic) reflection band (and higher even orders). This too is often considered desirable in many applications; however, as described further elsewhere herein, it may not be desirable to suppress the $2^{nd}$ order reflection band in some applications since a second harmonic of a primary reflection band can be utilized to provide additional flexibility in achieving a desired color output. For example, in some embodiments, a second harmonic is used to provide reflection in the blue wavelength range. Furthermore, according to some embodiments, it may be desired for the reflection band to have a relatively low reflectance. In this case, a smaller f-ratio (or an f-ratio closer to unity), along with the total number of layers and the difference in refractive indices between layers in an optical repeat unit, can be chosen to provide a desired reflectivity. The relative reflective powers of a primary reflection band and of harmonics of the primary reflection band as a function of f-ratio is described in U.S. Pat. No. 9,279,921 (Kivel et al.), for example, which is hereby incorporated herein by reference to the extent that it does not contradict the present description.

In some embodiments, the f-ratio is in a range of 0.06, or 0.1, or 0.2 to 0.4 or in a range of 0.6 to 0.8, or 0.9, or 0.94. In other embodiments, the f-ratio is in a range of 0.4 to 0.6, for example. In the embodiment of FIG. 2, the "A" layers are depicted for generality as being thinner than the "B" layers. Each depicted optical repeat unit (ORU 1, ORU 2, etc.) has an optical thickness (OT1, OT2, etc.) equal to the sum of the optical thicknesses of its constituent "A" and "B" layer, and each optical repeat unit provides $1^{st}$ order reflection of light whose wavelength λ is twice the overall optical thickness of the ORU.

To achieve a desired reflectivity with a reasonable number of layers, adjacent microlayers may exhibit a difference in refractive index ($|\Delta nx|$) for light polarized along the x-axis of at least 0.05, or at least 0.1, or at least 0.15, for example. Adjacent microlayers may exhibit a smaller difference in refractive index ($|\Delta ny|$) for light polarized along the y-axis. For example, in some embodiments, $|\Delta ny|$ is no more than 0.04, or no more than 0.02, or no more than 0.01. In some embodiments, the adjacent microlayers may exhibit a refractive index match or mismatch along the z-axis ($\Delta nz=0$ or $|\Delta nz|$ large), and the mismatch may be of the same or opposite polarity or sign as the in-plane refractive index mismatch(es). Whether the reflectivity of the p-polarized component of obliquely incident light increases, decreases, or remains the same with increasing incidence angle can be controlled by such tailoring of Δnz. The refractive indices and refractive index differences may be specified at a fixed reference wavelength (e.g., 532 nm) or may be specified for each optical repeat unit at the wavelength where the optical repeat unit is configured to reflect.

In some embodiments, the total number of optical repeat units in the optical stack is at least 25, or at least 30, or at least 35, or at least 40. In some embodiments, the total number of optical repeat units is no more than 300, or no more than 200, or no more than 180, or no more than 160, or no more than 150. A larger number of optical repeat units may be used in embodiments with a smaller (or closer to unity) f-ratio, and a smaller number of optical repeat units may be used in embodiments with an f-ratio near 0.5.

At least some of the microlayers in at least one packet of the multilayer optical films may be birefringent, e.g., uniaxially birefringent. In some cases, each ORU may include one birefringent microlayer, and a second microlayer that is either isotropic or that has a small amount of birefringence relative to the other microlayer. In alternative cases, each ORU may include two birefringent microlayers.

The multilayer optical films can be made using any suitable light-transmissive materials, but in many cases it is beneficial to use low absorption polymer materials. With such materials, absorption of a microlayer stack over visible and infrared wavelengths can be made small or negligible, such that the sum of reflection and transmission for the stack (or an optical film of which it is a part), at any given wavelength and for any specified angle of incidence and polarization state, is approximately 100%. i.e., $R+T\approx 100\%$, or $R\approx 100\%-T$. Exemplary multilayer optical films are composed of polymer materials and may be fabricated using coextruding, casting, and orienting processes. Reference is made to U.S. Pat. No. 5,882,774 (Jonza et al.) "Optical Film". U.S. Pat. No. 6,179,948 (Merrill et al.) "Optical Film and Process for Manufacture Thereof", U.S. Pat. No. 6,783,349 (Neavin et al.) "Apparatus for Making Multilayer Optical Films", and patent application publication US 2011/0272849 (Neavin et al.) "Feedblock for Manufacturing Multilayer Polymeric Films". The multilayer optical film may be formed by coextrusion of the polymers as described in any of the aforementioned references. The polymers of the various layers may be chosen to have similar rheological properties, e.g., melt viscosities, so that they can be co-extruded without significant flow disturbances. Extrusion conditions are chosen to adequately feed, melt, mix, and pump the respective polymers as feed streams or melt streams in a continuous and stable manner. Temperatures used to form and maintain each of the melt streams may be chosen to be within a range that avoids freezing, crystallization, or unduly high pressure drops at the low end of the temperature range, and that avoids material degradation at the high end of the range.

In brief summary, the fabrication method can include: (a) providing at least a first and a second stream of resin corresponding to the first and second polymers to be used in the finished film; (b) dividing the first and the second streams into a plurality of layers using a suitable feedblock, such as one that includes: (i) a gradient plate comprising first and second flow channels, where the first channel has a cross-sectional area that changes from a first position to a second position along the flow channel, (ii) a feeder tube plate having a first plurality of conduits in fluid communication with the first flow channel and a second plurality of conduits in fluid communication with the second flow channel, each conduit feeding its own respective slot die, each conduit having a first end and a second end, the first end of the conduits being in fluid communication with the flow channels, and the second end of the conduits being in fluid communication with the slot die, and (iii) optionally, an axial rod heater located proximal to said conduits; (c) passing the composite stream through an extrusion die to form a multilayer web in which each layer is generally parallel to the major surface of adjacent layers; and (d) casting the multilayer web onto a chill roll, sometimes referred to as a casting wheel or casting drum, to form a cast multilayer film. This cast film may have the same number of layers as the finished film, but the layers of the cast film are typically much thicker than those of the finished film. Furthermore, the layers of the cast film are typically all isotropic. A multilayer optical film with controlled low frequency variations in reflectivity and transmission over a wide wavelength range can be achieved by the thermal zone control of the axial rod heater, see e.g., U.S. Pat. No. 6,783,349 (Neavin et al.).

After the multilayer web is cooled on the chill roll, it can be drawn or stretched to produce a finished or near-finished multilayer optical film. The drawing or stretching accomplishes two goals: it thins the layers to their desired final thicknesses, and it may orient the layers such that at least some of the layers become birefringent. The orientation or stretching can be accomplished along the cross-web direction (e.g., via a tenter), along the down-web direction (e.g., via a length orienter), or any combination thereof, whether simultaneously or sequentially. If stretched along only one direction, the stretch can be "unconstrained" (wherein the film is allowed to dimensionally relax in the in-plane direction perpendicular to the stretch direction) or "constrained" (wherein the film is constrained and thus not allowed to dimensionally relax in the in-plane direction perpendicular to the stretch direction). The stretch can be asymmetric between orthogonal in-plane directions so that the resulting film will have a polarization dependent reflectivity. In some embodiments, the film may be stretched in a batch process. In any case, subsequent or concurrent draw reduction, stress or strain equilibration, heat setting, and other processing operations can also be applied to the film.

The film may be formed by coextruding one or more sets of films composed of large numbers of microlayers to constitute what is commonly called a packet of typically alternating isotropic and birefringent layers. The packets are typically formed in roll processes wherein the cross-web dimension is commonly labelled transverse direction (TD) and the dimension along the length of the roll is called machine direction (MD). Furthermore, the packets may be carefully stretched in the forming process in machine direction and transverse direction in carefully controlled temperature zones to affect the birefringent layers in what is commonly referred to as a tentering process. Furthermore, the tentering processes may provide either linear transverse stretch or parabolic stretch of the packets as they are formed. A controlled inward linear retraction commonly referred to as "toe-in" may be used to allow for controlled shrinkage during the cool down zone. The process can be used to provide 30 to 600 layers, for example, or more for desired optical effects and may also include external "skin" layers as needed.

Figure 3A:
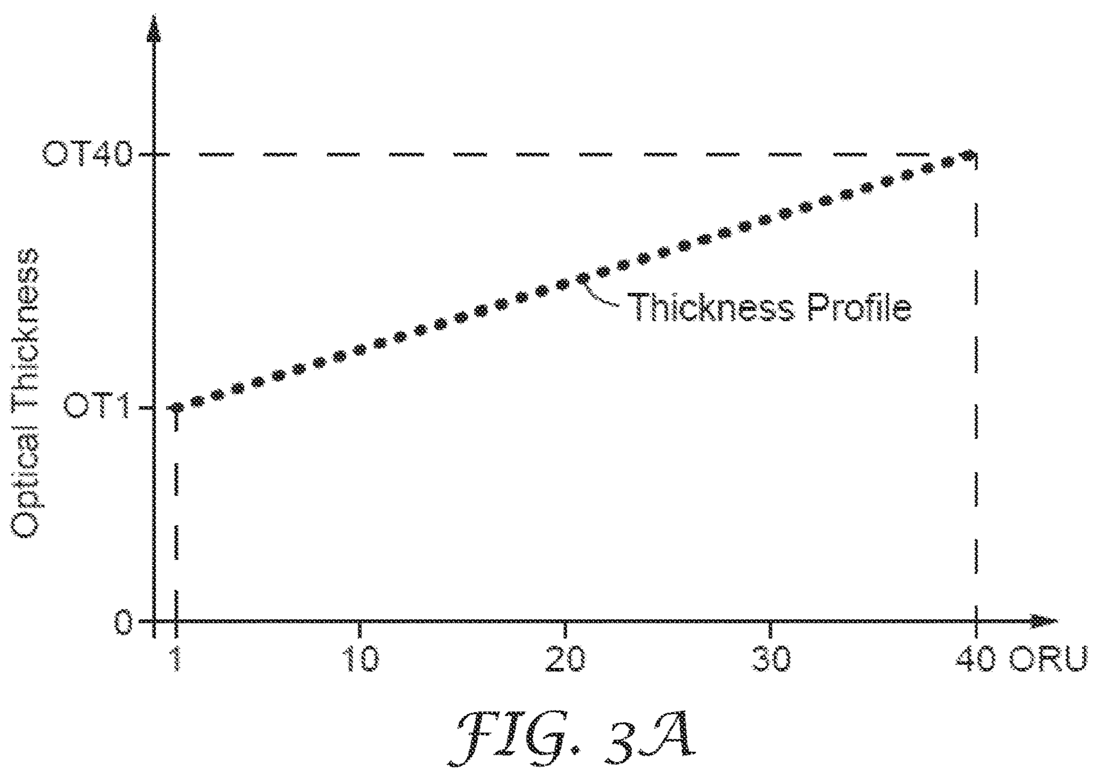
FIGS. 3A-3B are a schematic illustrations of layer thickness profiles of multilayer optical films.

The partial reflectors of the present description typically have a primary (first order) reflection band in the red and/or near infrared and optionally a second harmonic (second order) band partially in the blue. Each wavelength in an $m^{th}$-order band is 1/m times a wavelength in the first order band. The location and bandwidth of the higher order bands are therefore determined by the location and bandwidth of the first order band. In order to achieve a desired wavelength range for the primary reflection band and the second harmonic, it is desired that the primary reflection band lie in a suitable wavelength range (e.g., an infrared reflection band with a suitable bandwidth). This can be achieved by tailoring the thickness profile: that is, by tailoring the optical thicknesses of the ORUs according to a thickness gradient along the z-axis or thickness direction of the film, whereby the optical thickness of the optical repeat units increases, decreases, or follows some other functional relationship as one progresses from one side of the stack (e.g., the top) to the other side of the stack (e.g., the bottom). The thickness profile can also be tailored to adjust the slope of the primary reflection band and/or a sharpness of the band edges FIG. 3A is a schematic illustration of a layer thickness profile of an optical film having a single stack of optical repeat units. In this case, 40 optical repeat units are included and the thickness varies linearly across the film. In some embodiments, the layer thickness profile is substantially continuous. A layer thickness profile may be described as substantially continuous if to a good approximation (e.g., to within 10 percent error, or to within 5 percent error, or to within 3 percent error), the optical thickness of any interior optical repeat unit can be determined by linear extrapolation from the optical thickness of the optical repeat units on either side of the interior optical repeat unit.

Figure 3B:
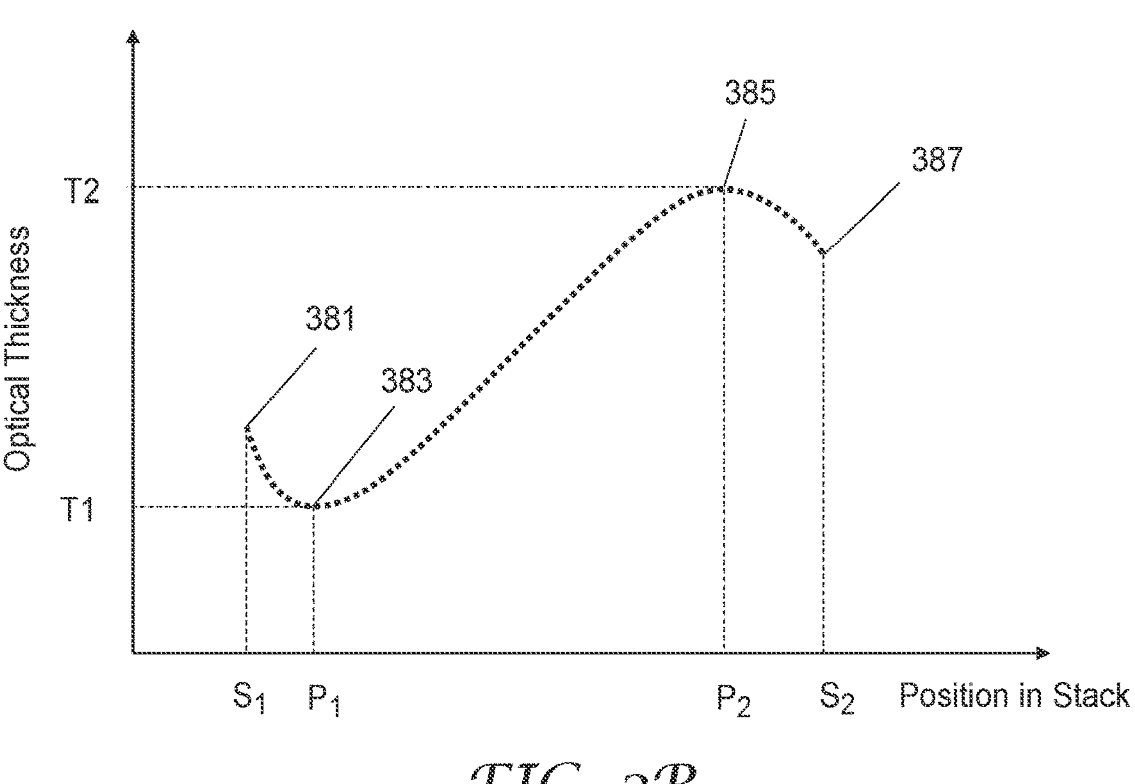

In some embodiments, the optical repeat units have an optical thickness that varies substantially continuously from a first side of the optical stack to an opposing second side of the stack. The thickness variation may be chosen to provide sharpened band edges as described in U.S. Pat. No. 6,157,490 (Wheatley et al.), for example, or may be chosen to provide a more gradual transition from high to low reflectivity. In some embodiments, the optical thickness of the optical repeat units varies between a minimum value and a maximum value, the maximum value minus the minimum value being no more than 35 percent of the maximum value and no less than 5 percent of the maximum value. In some embodiments, the optical thickness monotonically increases from a first side of the single stack to an opposing second side of the single stack. As illustrated in FIG. 3B, which is a plot of the optical thickness of the optical repeat units in a single stack as a function of vertical (z-coordinate of FIG. 2) position in the single stack, in some embodiments, the optical thickness monotonically decreases from an optical repeat unit 381 at the first side at position $S_1$ of the single stack to an optical repeat unit 383 (which has a smallest optical thickness T1) within the stack at position $P_1$, monotonically increases from the optical repeat unit 383 to an optical repeat unit 385 (which has a largest optical thickness T2) within the single stack at position $P_2$ disposed between the second side at positon $S_2$ of the single stack and the optical repeat unit 383, and monotonically decreases from the optical repeat unit 385 to the second side at positon $S_2$ of the single stack. In some embodiments, a separation between the first and second optical repeat units ($P_2$–$P_1$) is at least half, or at least 70%, of a thickness of the single stack ($S_2$−$S_1$). Other possible layer profiles include a smile profile (thinner in the middle of the stack than at the edges) and a frown profile (thicker in the middle of the stack than at the edges).

In some embodiments, the thickness variation of the optical repeat units is selected to give a desired slope of the primary reflection band. For example, the primary reflection band may be more reflective at higher wavelengths and less reflective at lower wavelengths, or may be less reflective at higher wavelengths and more reflective at lower wavelengths, or may have a substantially constant reflectivity in the primary reflection band. Adjusting the slope of the reflection band can provide additional flexibility to adjust the reflectivity with incidence angle and thereby adjust the output color of a display with view angle, for example.

In some embodiments, for wavelengths λ1<λ2<λ3, the partial reflector has a transmittance for normally incident light polarized along a first axis of at least 85% for wavelengths between λ1 and λ3, and the partial reflector has a first reflection band having band edges at λ2 and λ3 for normally incident light polarized along an orthogonal second axis. In some embodiments, the partial reflector has an f-ratio of the optical repeat units, a refractive index difference between the first and second polymer layers along the second axis, and a total number of optical repeat units in the optical stack such that the first reflection band has an average reflectance for normally incident light polarized along the second axis between 15% and 97%, or between 15% and 95%, or between 15% and 90%, or between 20% and 85%, or between 20% and 75%, or between 25% and 60%, for example. In some embodiments, the optical repeat units have a range of optical thicknesses such that (λ3−λ2)/(λ3+λ2) is at least 0.03, or at least 0.05, or at least 0.07, and no more than 0.25, or no more than 0.02, or no more than 0.015 (e.g., in a range of 0.05 to 0.2). For example, in some embodiments, the optical repeat units have a smallest optical thickness T1 proximate a first side (e.g., position S1) of the optical stack and a largest optical thickness T2 proximate an opposite second side (e.g., position S2) of the optical stack where (T2−T1)/(T2+T1) is in a range of 0.05 to 0.2 or in any of the ranges described for (λ3−λ2)/(λ3+λ2). A position within the optical stack may be described as proximate a first side of the optical stack if it is closer to the first side than the second side. Similarly, a position within the optical stack may be described as proximate a second side of the optical stack if it is closer to the second side than the first side. In some embodiments. T2 is at least 300 nm, or at least 325 nm, or at least 350 nm, or at least 355 nm, or at least 360 nm, or at least 375 nm. In some embodiments. T2 is no more than 1250 nm, or no more than 800 nm, or no more than 500 nm, or no more than 450 nm.

Figure 4:
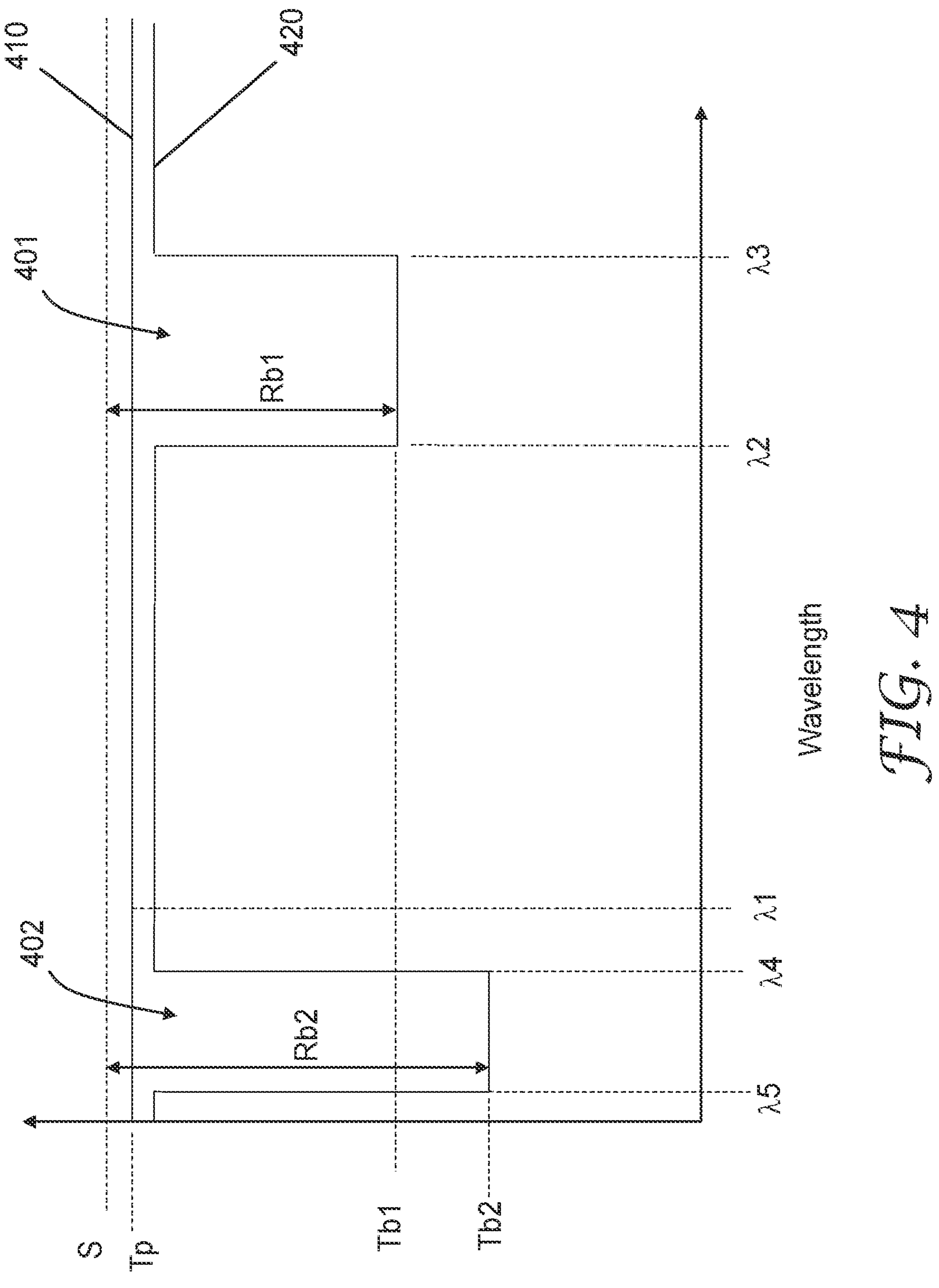
FIG. 4 is a schematic plot of the transmittance versus wavelength of a wavelength and polarization dependent partial reflector.

The transmittance of a wavelength and polarization dependent partial reflector or partial reflective polarizer is schematically illustrated in FIG. 4. In the illustrated embodiment, the transmittance 410 in the pass state (polarization state with light polarized along a first (pass) axis) for normally incident light has the value Tp which may be at least 85%, or at least 90%, for example. In some embodiments, the transmittance in the pass state for normally incident light is at least 85%, or at least 90°/o over at least a wavelength range from λ1 to λ3. The transmittance 420 in the block state (polarization state with light polarized along a second (block) axis) exhibits a first reflection band 401 and a second reflection band 402. In some embodiments, the first reflection band 401 is a primary reflection band and the second reflection band 402 is a second harmonic of the primary reflection band. The first reflection band 401 has a shorter wavelength band edge of λ2 and a longer wavelength band edge of λ3. In some embodiments, λ2 is about 2 times a smallest optical thickness T1 of the optical stack of the partial reflector, and λ3 is about 2 times a largest optical thickness T2 of the optical stack. The second reflection band 402 has a shorter wavelength band edge of λ5 and a longer wavelength band edge of λ4. In embodiments where the first reflection band 401 is a primary reflection band and the second reflection band 402 is a second harmonic of the primary reflection band, λ5 is about λ2/2 and λ4 is about λ3/2. In some embodiments, the first reflection band 401 includes near infrared wavelengths (i.e., at least one wavelength between 700 nm and 2500 nm is included in the range from λ2 to λ3). In some embodiments, the second reflection band 402 includes visible wavelengths (i.e., at least one wavelength in a range of 400 nm to 700 nm (e.g., 400 nm) is included in the range from λ5 to λ4). In other embodiments, λ4 may be less than 400 nm. In some embodiments, λ4 is no more than 500 nm, or no more than 450 nm, or no more than 430 nm, or no more than 410 nm. In some embodiments, λ4 is in a range of 400 nm to 500 nm.

In some embodiments, the first reflection band is a primary reflection band having a band edge λ3 of at least 700 nm, or at least 710 nm, or at least 720 nm, or at least 750 nm. In some embodiments, the band edge λ3 is no more than 2500 nm, or no more than 1500 nm, or no more than 1000 nm, or no more than 900 nm. For example, in some embodiments, λ3 is in a range of 700 nm to 2500 nm, or 710 nm to 1000 nm, or 720 nm to 900 nm, or 750 nm to 900 nm. In some embodiments, the band edge λ2 is at least 600 nm, or at least 610 nm, or at least 620 nm. In some embodiments, λ2 is no more than 750 nm, or no more than 710 nm, or no more than 700 nm, or no more than 690 nm, or no more than 680 nm. For example, in some embodiments, λ2 is in a range of 600 nm to 700 nm, or in a range of 610 nm to 690 nm. In some embodiments, λ1 is no more than 480 nm, or no more than 450 nm, or no more than 420 nm, or no more than 400 nm. In some embodiments, λ1 is at least 380 nm, or at least 400 nm. For example, in some embodiments, λ1 is in a range of 380 nm to 480 nm, or in a range of 400 nm to 450 nm. In some embodiments, λ1 is 400 nm.

In some embodiments, the first reflection band of a partial reflector is centered on a wavelength λc between 900 nm and 980 nm (e.g., 940 nm), for example, and satisfies 0.05≤(λ3−λ2)/(λ3+λ2)≤0.2. The partial reflector could be adapted to reflect wavelengths near λc at one angle of incidence but not at another angle of incidence due to the band shift with incidence angle. Such partial reflectors are useful in sensor systems, for example, as described further elsewhere herein.

The first reflection band 401 has an average transmittance for normally incident light polarized along the second axis of Tb1. The corresponding average reflectance, Rb1, for normally incident light polarized along the second axis is S−Tb1, where S is the sum of the average reflectance and the average transmittance which may be about 100% neglecting surface reflections and absorption. In some embodiments, the reflectance is not constant over the band width of the reflection band. The average reflectance over a band can be expressed as the integral of the reflectance over wavelengths in the band divided by the width (e.g., λ3−λ2) of the band. In some embodiments. Rb1 is greater than 15%, or greater than 20%, or greater than 25%, or greater than 30%. In some embodiments. Rb1 is less than 97%, or less than 95%, or less than 90%, or less than 75%, or less than 60%. For example, in some embodiments, Rb1 is between 15% and 90%, or between 20% and 75%, or between 25% and 60%. Similarly, in some embodiments, Tb1 is between 10% and 85%, or between 25% and 80%, or between 40% and 80%. The second reflection band 402 has an average transmittance for normally incident light polarized along the second axis of T2. The corresponding average reflectance, Rb2, for normally incident light polarized along the second axis is S−Tb2. Rb2 may be in any of the ranges described for Rb1. Similarly, Tb2 may be in any of the ranges described for Tb1. Rb2 may be greater than, less than, or about equal to Rb1 depending on the f-ratio of the optical stack of the partial reflector.

Figure 5:
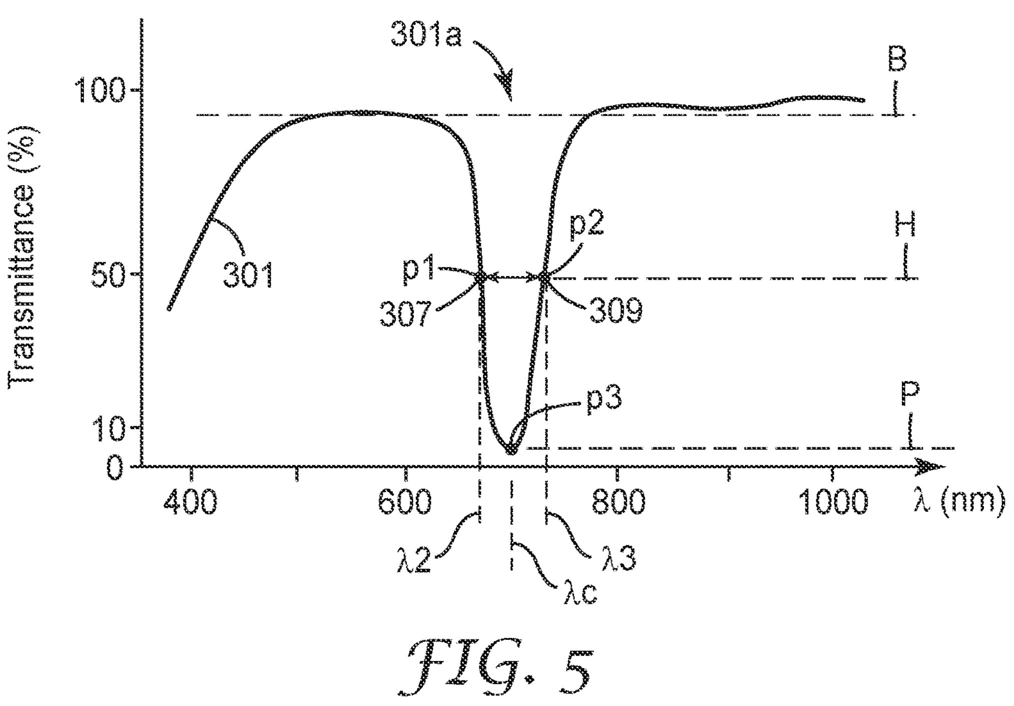
FIG. 5 is a schematic graph of the transmission spectrum of a partial reflector.

FIG. 5 is a schematic graph of the transmission spectrum of a hypothetical partial reflector. In this figure, transmittance is plotted against wavelength λ in nanometers, the wavelength axis extending over the range from 400 to 1000 nm. The curve 301 may represent the measured transmittance for light at normal incidence polarized along a block axis. The illustrated reflector selectively blocks light within a narrow band in a portion of the red and near infrared region of the spectrum, evidenced by the relatively low transmittance of the reflection band 301*a* of the curve 301.

In order to quantify, relevant features of the curve 301, a baseline value B of the curve 301, a peak value P of the curve 301 (in this case the peak value P corresponds to a transmittance minimum for the reflection band 301*a*, shown at point p3), and an intermediate value H of the curve 301, halfway between P and B are identified in FIG. 5. The curve 301 intersects with the value H at the points p1 and p2. These points lie on the shorter wavelength band edge 307 and the longer wavelength band edge 309, respectively, of the reflection band 301*a* and define the shorter wavelength band edge wavelength λ2 and the longer wavelength band edge wavelength λ3. The shorter and longer wavelength band edge wavelengths can be used to calculate two other parameters of interest: the width (full width at half-maximum, or "FWHM") of the reflection band 301*a*, which equals λ3−λ2; and the center wavelength λc of the reflection band 301*a*, which equals (λ2+λ3)/2. Note that the center wavelength λc may be the same as or different from the peak wavelength (see point p3) of the reflection band 301*a*, depending on how symmetrical or asymmetrical the reflection band 301*a* is.

The transmittance of an optical element refers generally to the transmitted light intensity divided by the incident light intensity (for light of a given wavelength, incident direction, etc.), but may be expressed in terms of "external transmittance" or "internal transmittance". The external transmittance of an optical element is the transmittance of the optical element when immersed in air, and without making any corrections for Fresnel reflections at the air/element interface at the front of the element or for Fresnel reflections at the element/air interface at the back of the element. The internal transmittance of an optical element is the transmittance of the element when the Fresnel reflections at its front and back surfaces have been removed. The removal of the front and back Fresnel reflections may be done either computationally (e.g. by subtracting an appropriate function from the external transmission spectrum), or experimentally. For many types of polymer and glass materials, the Fresnel reflections are about 4 to 6% (for normal or near-normal angles of incidence) at each of the two outer surfaces, which results in a downward shift of about 10% for the external transmittance relative to the internal transmittance. FIG. 5 does not specify which of these transmittances is used, hence, it may generally apply to either internal or external transmittance. If transmittance is referred to herein without being specified as internal or external, it may be assumed that the transmittance refers to external transmittance, unless otherwise indicated by the context.

In some embodiments, a polymeric multilayer optical film may have a reflection band having a maximum reflectance (e.g., at point p3 in FIG. 3) of at least 15%, or at least 20%, or at least 25%, or at least 30% (or a minimum transmittance that is less than 85%, or less than 80%, or less than 75%, or less than 70%). In some cases, the internal transmittance through the optical film may be at least 80% in regions on either side of the reflection band, or at least 20% higher than the minimum transmittance on either side of the reflection band. For example, in some embodiments, the optical film may have a minimum internal transmittance in the reflection band of less than 40% and may have an internal transmittance of at least 80% at a wavelength 10 nm shorter, or 20 nm shorter, or 30 nm shorter than a shorter wavelength band edge of the reflection band, and/or the optical film may have an internal transmittance of at least 80% at a wavelength 10 nm longer, or 20 nm longer, or 30 nm longer than a longer wavelength band edge of the reflection band.

The partial reflectors of the present description are useful in display applications and have been found to provide reduced color shift in OLED displays incorporating the partial reflector in a circular polarizer. The partial reflectors may also be advantageously used in other display applications and in non-display applications. For example, the partial reflectors can be used in a recycling cavity of a liquid crystal display or of a light source used in display or non-display applications to adjust the wavelength distribution of the light output as a function of angle. As another example, the partial reflectors may be used in sensors or sensor systems where it may be desired to block or partially block one polarization in a relatively narrow near-infrared wavelength range (e.g., (λ3−λ2)/(λ3+λ2) in a range of 0.05 to 0.2 where the wavelength range from λ2 to λ3 includes near-infrared wavelengths). For example, the partial reflector may be used in an optical filter covering a sensor, or covering a light source used in a sensor application, or disposed on a marker (e.g., a retroreflective marker) used in a sensor application. In some embodiments, a partial reflector of the present description is used as the near-infrared polarizer of an optical filter including a near-infrared polarizer and a visible light blocking filter, and may be used in an optical system or optical device including the optical filter and one or more of a sensor, a near-infrared light source, and a marker. For example, the partial reflectors of the present description, may be used as the polarizer in the optical filters described in PCT Appl. No. PCT/US2017/034941 (Wheatley et al.), which is hereby incorporated herein by reference to the extent that it does not contradict the present description. The partial reflectors of the present description may also be used in optical systems and optical devices such as those described in PCT Appl. No. PCT/US2017/034941 (Wheatley et al.). In some embodiments, a partial reflector of the present description is used in an optical device selected from the group consisting of a wearable electronic device, a medical diagnostic device, a cell phone, a near-infrared marker, a component of a garage door opening system, and a component of a driver assistance system. In some embodiments, a partial reflector of the present description is used in an optical system selected from the group consisting of a medical diagnostic system, a garage door opening system, and a driver assistance system.

Figure 6:
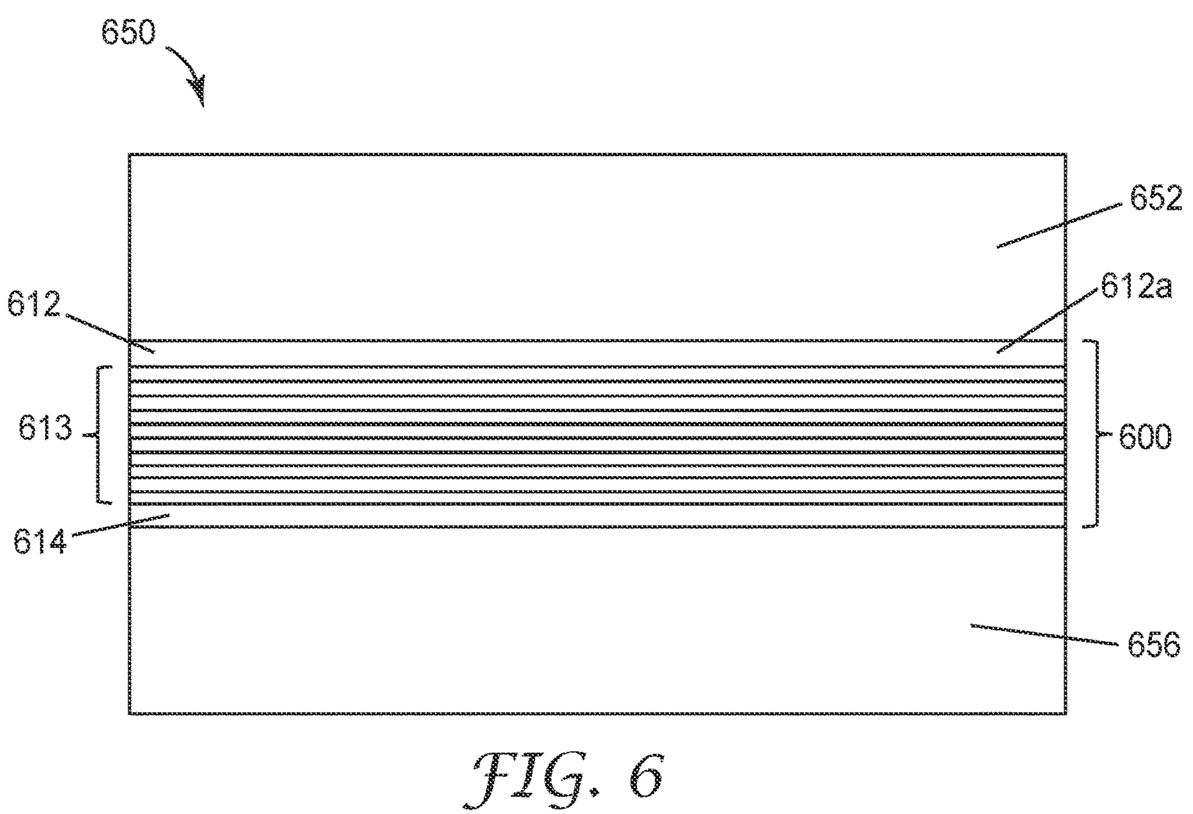
FIG. 6 is a schematic cross-sectional view of a circular polarizer.

The partial reflectors of the present description have been found to be particularly advantageous in correcting the color shift of a display, such as an OLED display, with view angle. In some embodiments, the partial reflector is a color-correcting partial reflector which is disposed in a circular polarizer between a linear absorbing polarizer and a retarder. FIG. 6 is a schematic cross-sectional view of a circular polarizer 650 including a linear absorbing polarizer 652, a partial reflector 600 and a retarder 656. The partial reflector 600 may be any wavelength and polarization dependent partial reflector or reflective polarizer described herein. Partial reflector 600 includes optical stack 613, which includes plurality of alternating polymer layers, and includes optically thick layers 612 and 614.

In some embodiments, partial reflector 600 is a reflective polarizer disposed between the linear absorbing polarizer 652 and the retarder 656, where the reflective polarizer has a primary reflection band having a shorter wavelength band edge (e.g., λ2 of FIG. 4) at a wavelength of at least 600 nm.

In some embodiments, partial reflector 600 is a reflective polarizer disposed between the linear absorbing polarizer 652 and the retarder 656, where the reflective polarizer includes an optical stack including a plurality of optical repeat units where each optical repeat unit includes first and second polymer layers, and where a refractive index difference between the first and second polymer layers along a first axis is Δny, a refractive index difference between the first and second polymer layers along an orthogonal second axis is Δnx. In some embodiments, |Δnx| is at least 0.1 and |Δny| is no more than 0.04. In some embodiments, for refractive indices along the second axis, the optical repeat units have a smallest optical thickness T1 proximate a first side of the optical stack and a largest optical thickness T2 proximate an opposite second side of the optical stack. T2 and/or (T2−T2)/(T2+T2) may be in any of the ranges described elsewhere herein. For example, in some embodiments. T2 is at least 300 nm, or at least 350 nm, and/or is no more than 1250 nm.

Figure 7:
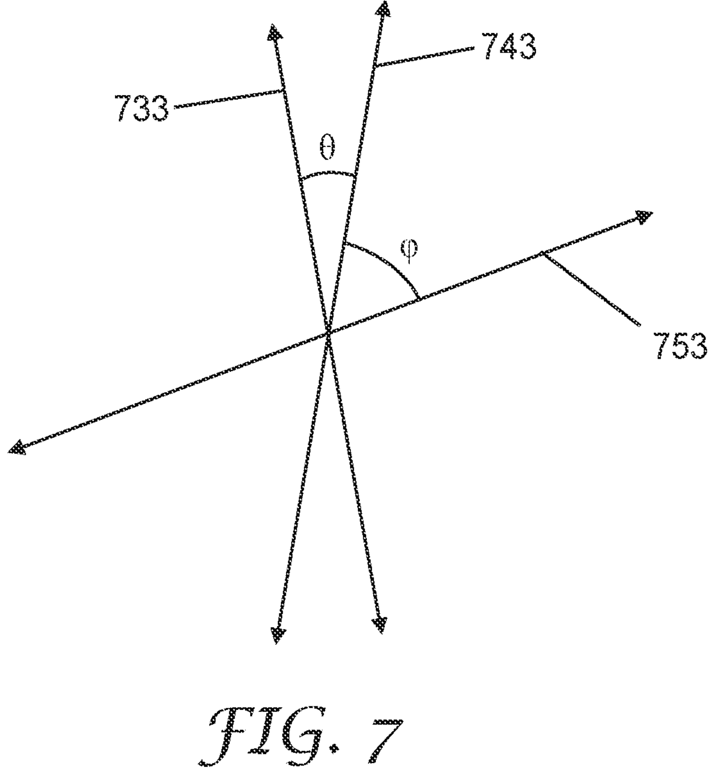
FIG. 7 is a schematic illustration of a pass axis of a partial reflector, a pass axis of a linear absorbing polarizer, and a fast axis of a retarder.

FIG. 7 is a schematic illustration of a first axis 733 of a partial reflector, which is a pass axis of the partial reflector, and a pass axis 743 of a linear absorbing polarizer. An angle θ between the pass axis 743 and the first axis 733 is illustrated. If the angle θ is less than 20 degrees, the pass axis 743 may be described as substantially aligned with the first axis 733. In some embodiments, the angle θ is less than 10 degrees, or less than 5 degrees. A fast axis 753 of a retarder is also illustrated. The fast axis 753 makes an oblique angle φ with the pass axis 743 of the linear absorbing polarizer. In some embodiments, the oblique angle φ is between 40 and 50 degrees. In some embodiments, φ is about 45 degrees.

Figure 8:
FIG. 8 is a schematic cross-sectional view of a retarder.
Figure 9:
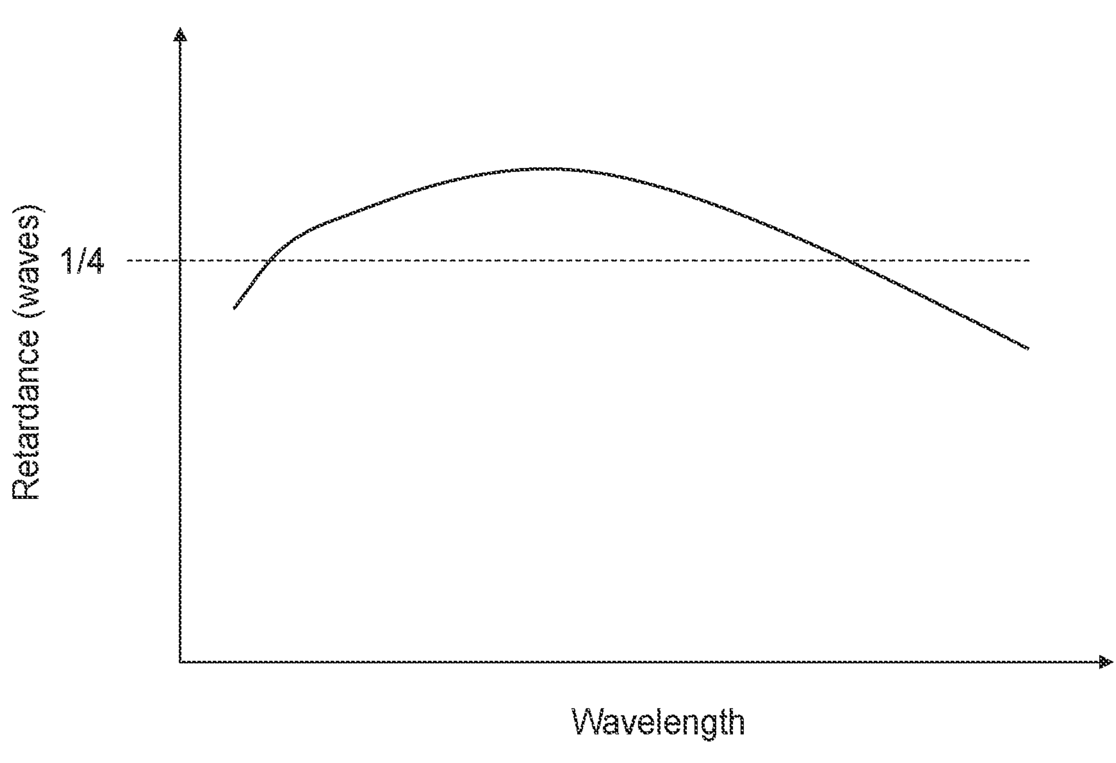
FIG. 9 is a schematic plot of retardance versus wavelength for an achromatic retarder.

In some embodiments, a retarder includes a plurality of retarder layers. FIG. 8 is a schematic cross-sectional view of a retarder 856 including a first retarder layer 857 and a second retarder layer 859. In some embodiments, additional retarder layers may be included. Multiple retarder layers may be utilized to give a retardance in waves (e.g., the retardance in nm divided by the wavelength in nm) that is independent or only weakly dependent on wavelength. FIG. 9 is a schematic plot of retardance in waves versus wavelength for a hypothetical achromatic retarder. The achromatic retarder may have a single layer or may include multiple layers. In the illustrated embodiment, the retardance is one fourth of the wavelength at two wavelengths. In some embodiments, for at least one wavelength in a range from 400 nm to 700 nm, the retarder has a retardance of one fourth of the wavelength. In some embodiments, the retarder has a retardance of one fourth the wavelength for one wavelength and in some embodiments, the retarder has a retardance of one fourth the wavelength for two or more wavelengths. In some embodiments, the retarder has a retardance different from quarter wave. For example, a retardance of (n+¼)λ may be used.

Figure 10:
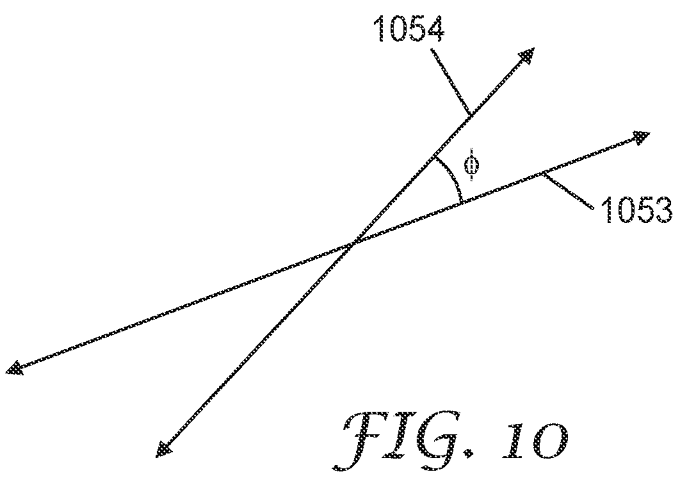
FIG. 10 is a schematic illustration of a first fast axis of a first retarder layer and a second fast axis of a second retarder layer.

Any retarder which allows the circular polarizer to function as a circular polarizer may be used. In some embodiments, a retarder includes a plurality of retarder layers where a first retarder layer in the plurality of retarder layers has a first fast axis and a second retarder layer in the plurality of retarder layers has a second fast axis. In some embodiments, the first and second fast axes are parallel and in some embodiments, the first and second fast axes are not parallel. Non-parallel fast axes may be used in a retarder of a circular polarizer for improving the achromaticity of the circular polarizer. FIG. 10 schematically illustrates a first fast axis 1053 of a first retarder layer and a second fast axis 1054 of a second retarder layer where the first and second fast axes 1053 and 1054 are not parallel. The angle ϕ between the first and second fast axes 1053 and 1054 may be any suitable angle. In some embodiments, ϕ is about 0 degrees (e.g., between −5 degrees and 5 degrees). In other embodiments, ϕ is between 0 degrees and 45 degrees, or between 45 degrees and 90 degrees.

Figure 11A:
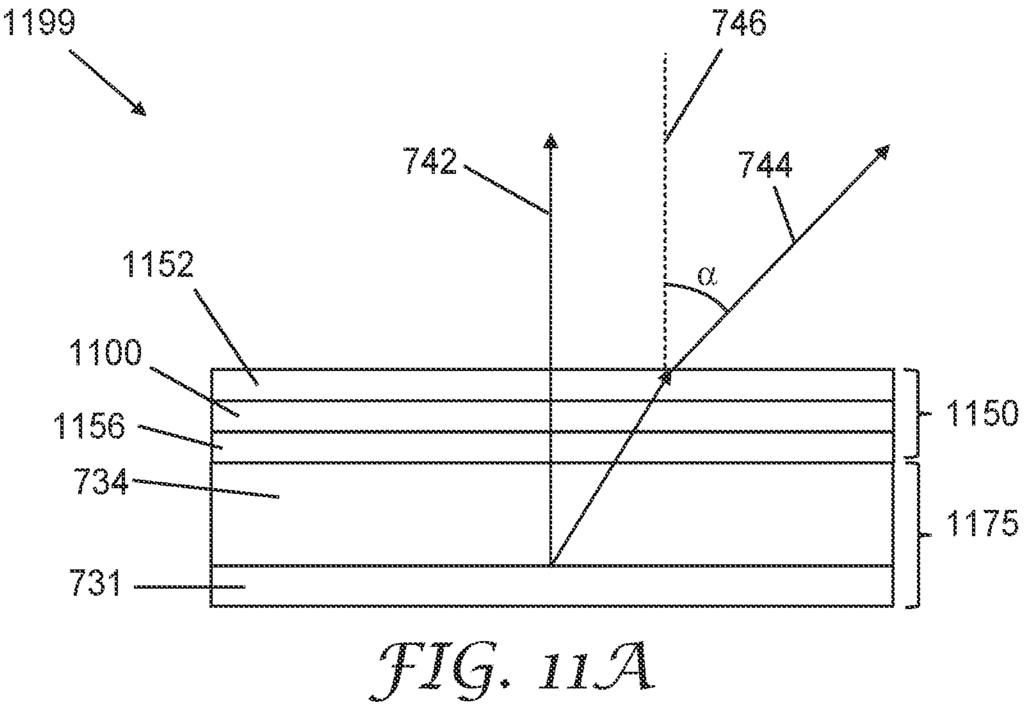
FIGS. 11A-11B are schematic cross-sectional views of displays that include a circular polarizer and an organic light emitting diode (OLED) display panel.

FIG. 11A is a schematic cross-sectional view of a display 1199 including a circular polarizer 1150 and an OLED display panel 1175. The circular polarizer 1150 may be any circular polarizer described herein. In the illustrated embodiment, the circular polarizer 1150 includes linear absorbing polarizer 1152, partial reflector 1100, and retarder 1156. The partial reflector 1100 may be any wavelength and polarization dependent partial reflector or reflective polarizer described herein. In the illustrated embodiment, the OLED display panel 1175 includes an OLED stack 731 and an interior layer 734. The OLED stack 731 typically includes an emissive layer, electrodes, and a hole transport layer. The interior layer 734 may be an encapsulant layer for the OLED stack 731. In some embodiments, other layers are disposed between the circular polarizer 1150 and the OLED stack 731. Additional layers such as a touch sensitive layer, for example, may also be included. FIG. 11A illustrates a first light output 742 at a view angle of zero degrees relative to a normal 746 to the display 1199 and a second light output 744 at a view angle of a relative to the normal 746. The view angle α may be 45 degrees and the display may be fully on when various colors and color differences are specified. As used herein, unless specified differently, the view angle refers to the view angle relative to the normal to the display as observed in air external to the display.

Figure 11B:
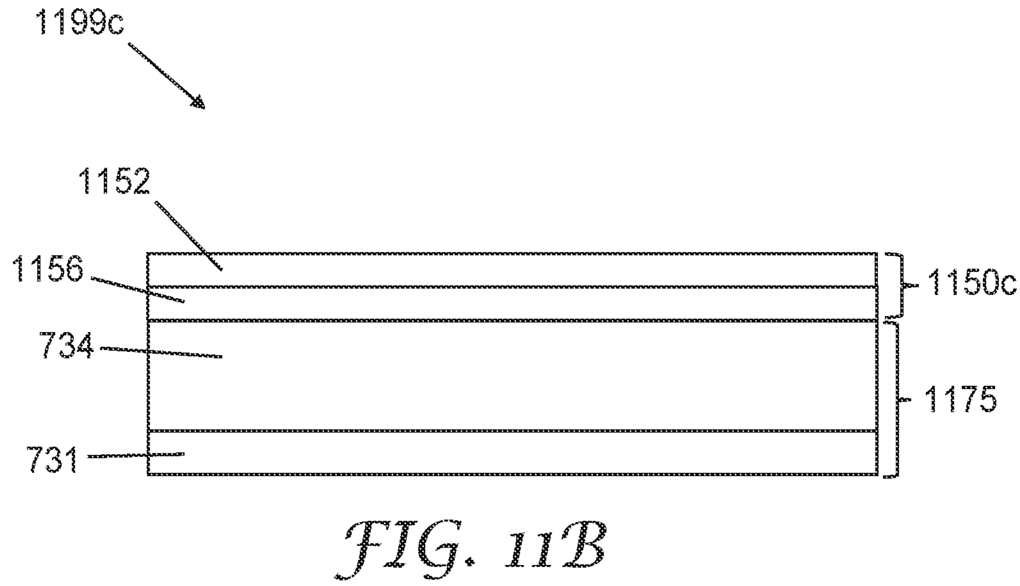

The color of light 744 may be different from the color of light 742 when the display is fully on. In some embodiments, the color shift or chromaticity difference between light 744 and light 742 is less than that of a comparative display which is otherwise equivalent to display 1199 except that the partial reflector 1100 is omitted. FIG. 11B is a schematic cross-sectional view of a display 1199*c* which is otherwise equivalent to display 1199 except that the partial reflector 1100 is not included. The circular polarizer 1150 has been replaced with the comparative circular polarizer 1150*c* which includes the linear absorbing polarizer 1152 and the retarder 1156, but not the partial reflector 1100.

In some embodiments, the display 1199 has a Δu'v' color shift at a view angle of 45 degrees that is no more than 0.8 times, or no more than 0.5 times that of the otherwise equivalent display 1199*c*. The Δu'v' color shift refers to the color shift or chromaticity distance as observed in air external to the display when the display is fully on. The Δu'v' color shift or chromaticity distance refers to the Euclidean distance between two points in the CIE (Commission Internationale de l'Eclairage) 1976 UCS (Uniform Chromaticity Scale) chromaticity diagram. For example, if a first color has CIE 1976 UCS color coordinates $(u'_1,v'_1)$ and a different second color has CIE 1976 UCS color coordinates $(u'_2,v'_2)$, the chromaticity distance between the two colors is given by the positive square root of $(\Delta u'v')^2=(u'_2-u'_1)^2+(v'_2-v'_1)^2$.

Figure 12A:
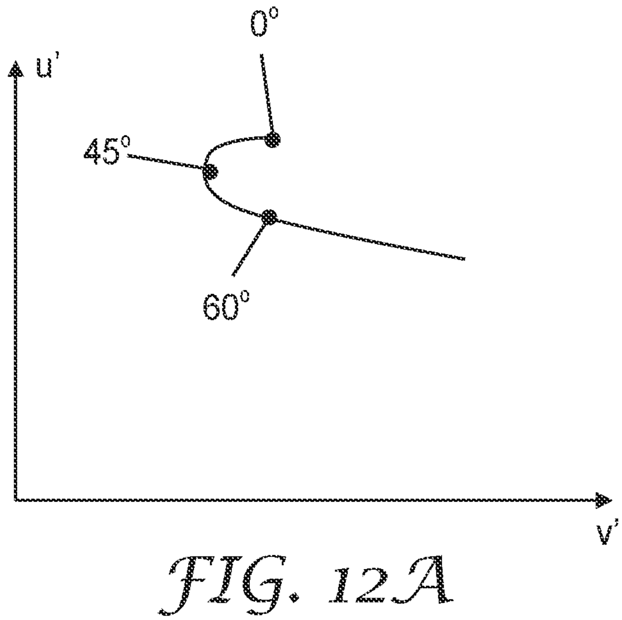
FIGS. 12A-12B are schematic chromaticity plots showing the variation of the color output of displays with view angle.
Figure 12B:
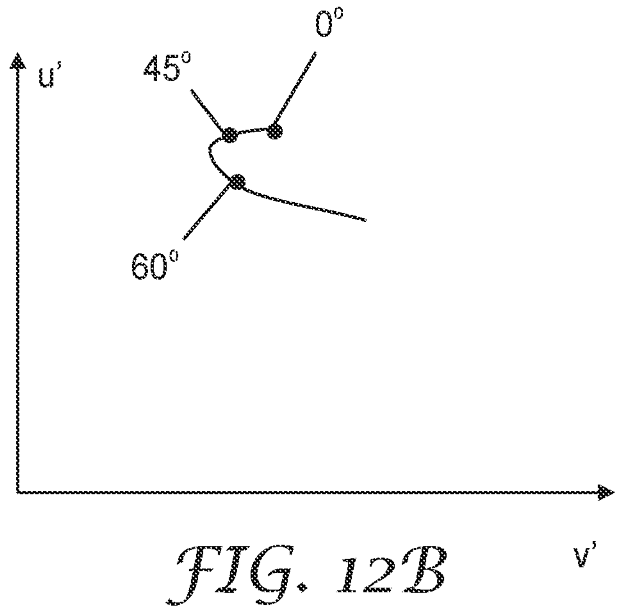

FIGS. 12A-12B are schematic CIE 1976 UCS u'v' plots showing the variation of the color output of OLED displays with view angle. FIG. 12A shows the color output of a display not including the partial reflector (e.g., display 1199*c*) and FIG. 12B shows the color output of the display when a partial reflector of the present description is included in a circular polarizer of the display (e.g., display 1199). Points corresponding to view angles in air of 0.45 and 60 degrees are shown on both plots. Similarly plots using CIE xy coordinates can be used in addition to or instead of CIE u'v' plots to illustrate the variation in color output. The color shift with view angle is substantially reduced when the partial reflector is included. The partial reflector provides a color shift by recycling light having a polarization such that it would otherwise be absorbed by the absorbing polarizer. In some embodiments, this provides a gain that is wavelength and view angle dependent due to the wavelength dependence of the reflectivity of the partial reflector.

Figure 13:
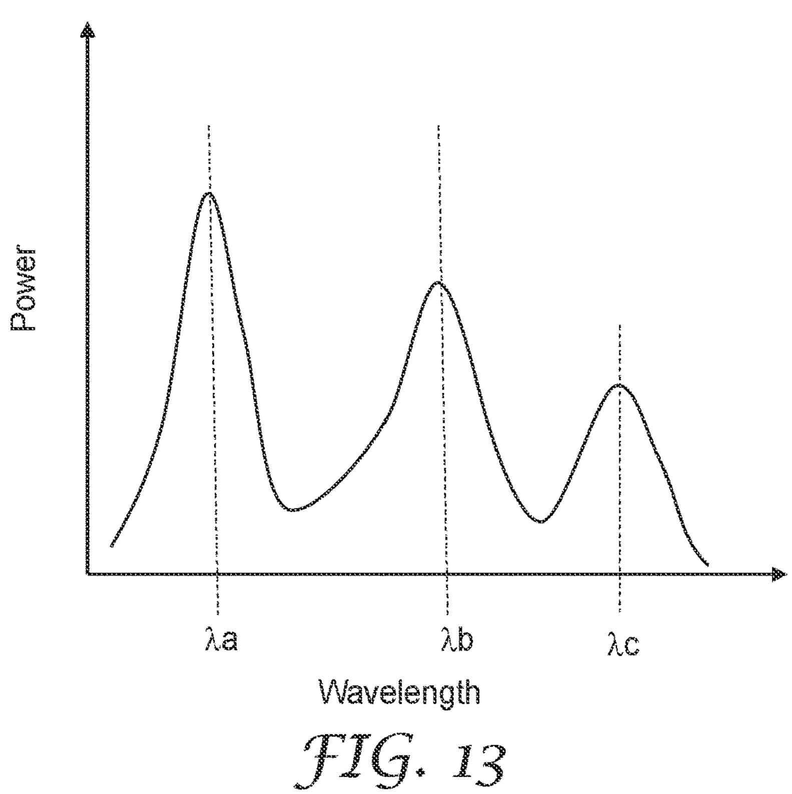

FIG. 13 is a schematic plot of a spectrum produced by a display as viewed normal (zero view angle) to the display when the display is fully on. The display includes an OLED display panel having an emission spectra that includes first, second and third peak emission wavelengths λa, λa and λb where λa<λb<λc. In some embodiments, the display includes a circular polarizer disposed proximate the display panel, where the circular polarizer includes a reflective polarizer, which may be any of the partial reflectors described elsewhere herein, disposed between a linear absorbing polarizer and a retarder.

In some embodiments, the wavelength dependence of the reflectance and transmittance of the reflective polarizer is selected based on the wavelengths λa, λa and λb of the display that the reflective polarizer is configured to be incorporated into. For example, the wavelengths λ1, λ2 and λ3 (see, e.g., FIG. 4) may be chosen relative to the wavelengths λa, λa and λb. In some embodiments, the reflective polarizer has a transmittance for normally incident light polarized along a pass axis of the reflective polarizer of at least of at least 85% for wavelengths between λa and λc, and a transmittance for normally incident light polarized along a block axis of the reflective polarizer of at least of at least 85% for wavelengths between ½(λa+λb) and ½(λb+λc). In some embodiments, the transmittance for normally incident light polarized along the block axis of the reflective polarizer is at least 80%, or at least 85%, for wavelengths between λa and λc. In some embodiments, for a wavelength λ3>λc and a wavelength λ2 satisfying ½(×b+λc)<λ2<λ3, the reflective polarizer has a first reflection band having band edges at λ2 and λ3 for normally incident light polarized along the block axis. In some embodiments, the first reflection band has an average reflectance for normally incident light polarized along the block axis between 15% and 90%, or in any of the other ranges described elsewhere herein. In some embodiments, for refractive indices along the second axis, the optical repeat units of the reflective polarizer have a range of optical thicknesses such that (λ3−λ2)/(λ3+λ2) is in a range of 0.05 to 0.2.

In some embodiments, the first reflection band is a primary reflection band. In some embodiments, the reflective polarizer has a second reflection band which is a second harmonic of the primary band where the second band has a wavelength range that includes 400 nm. In some embodiments, λ3<2λa. In some embodiments where this wavelength relationship is satisfied, the first reflection band is a primary reflection band, and the second harmonic has a longer wavelength band edge λ4 that is less than λa. This may be useful when little or no gain from including the partial reflector is desired for blue light at a view angle of zero degrees. In some embodiments. λa+λb≥λ3≥2λa. In some embodiments where this wavelength relationship is satisfied, the first reflection band is a primary reflection band, and the second harmonic has a longer wavelength band edge λ4 that is greater than or equal to λa but less than or equal to the midpoint between λa and λb (i.e., ½(λa+λb)). This may be useful when some gain from including the partial reflector is desired for blue light at a view angle of zero degrees, but little or no gain is desired for green light.

The gain provided by the partial reflector is the emission intensity at a given view angle and wavelength provided by a display including the partial reflector when the display is fully on divided by the emission intensity at the given view angle and wavelength of an otherwise equivalent display not including the partial reflector when the otherwise equivalent display is fully on. The gain typically depends on wavelength due to the wavelength dependence of the reflectivity of the partial reflector. The gain typically depends on view angle due to the shift of the reflection band(s) of the partial reflector with view angle. In some embodiments, the partial reflector is a reflective polarizer adapted to provide a gain of at least 1.15 for wavelengths between λc and 700 nm at a view angle of 45 degrees, and to provide a gain of between 1.00 and 1.05 at the wavelength c at a view angle of zero degrees. In some embodiments, the partial reflector is a reflective polarizer adapted to provide a gain for wavelengths between 620 nm and 700 nm at a view angle of 30 degrees that is less than a gain for wavelengths between 620 nm and 700 nm at a view angle of 45 degrees. As described further elsewhere herein, in some embodiments, as a result of the wavelength and view angle dependent gain provided by the partial reflector, the display has a Δu'v' color shift at a view angle of 45 degrees that is substantially less than (e.g., no more than 0.8 times or no more than 0.5 times) that of an otherwise equivalent display not including the partial reflector.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description. "about" will be understood to mean within 5 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.95 and 1.05, and that the value could be 1.

The following is a list of exemplary embodiments of the present description.

Embodiment 1 is a wavelength and polarization dependent partial reflector comprising an optical stack, the optical stack comprising a plurality of optical repeat units, each optical repeat unit including first and second polymer layers, wherein for wavelengths λ1<λ2<λ3, the partial reflector has a transmittance for normally incident light polarized along a first axis of at least 85% for wavelengths between λ1 and λ3, wherein the partial reflector has a first reflection band having band edges at λ2 and λ3 for normally incident light polarized along an orthogonal second axis, the partial reflector having an f-ratio of the optical repeat units, a refractive index difference between the first and second polymer layers along the second axis, and a total number of optical repeat units in the optical stack such that the first reflection band has an average reflectance for normally incident light polarized along the second axis between 15% and 97%.

wherein the optical repeat units have a range of optical thicknesses such that (λ3−λ2)/(λ3+λ2) is in a range of 0.05 to 0.2, and wherein the first reflection band is a primary reflection band and λ3 is at least 700 nm and no more than 2500 nm.

Embodiment 2 is the partial reflector of Embodiment 1, wherein the average reflectance for normally incident light polarized along the second axis is between 15% and 95%.

Embodiment 3 is the partial reflector of Embodiment 1, wherein the average reflectance for normally incident light polarized along the second axis is between 15% and 90%.

Embodiment 4 is the partial reflector of Embodiment 1, wherein the average reflectance for normally incident light polarized along the second axis is between 20% and 75%.

Embodiment 5 is the partial reflector of Embodiment 1, wherein the average reflectance for normally incident light polarized along the second axis is between 25% and 60%.

Embodiment 6 is the partial reflector of Embodiment 1, wherein for refractive indices along the second axis, the optical repeat units have a smallest optical thickness T1 proximate a first side of the optical stack and a largest optical thickness T2 proximate an opposite second side of the optical stack, (T2−T1)/(T2+T1) being in a range of 0.05 to 0.2.

Embodiment 7 is the partial reflector of Embodiment 1, wherein λ1 is in a range of 380 nm to 480 nm, λ2 is in a range of 600 nm to 700 nm, and λ3 is in a range of 710 nm to 1000 nm.

Embodiment 8 is the partial reflector of Embodiment 1, wherein MI is in a range of 400 nm to 450 nm, λ2 is in a range of 600 nm to 700 nm, and λ3 is in a range of 720 nm to 900 nm.

Embodiment 9 is the partial reflector of Embodiment 1, wherein λ1 is 400 nm, λ2 is in a range of 610 nm to 690 nm, and λ3 is in a range of 750 nm to 900 nm.

Embodiment 10 is the partial reflector of Embodiment 1, wherein the f-ratio or 1 minus the f-ratio is in a range of 0.06 to 0.4.

Embodiment 11 is the partial reflector of Embodiment 1, wherein the f-ratio is in a range of 0.4 to 0.6.

Embodiment 12 is the partial reflector of Embodiment 1, wherein the total number of optical repeat units in the optical stack is in a range of 35 to 160.

Embodiment 13 is the partial reflector of Embodiment 1, wherein at least one of the first and second polymer layers is birefringent.

Embodiment 14 is the partial reflector of Embodiment 1, wherein the refractive index difference between the first and second polymer layers along the second axis is Δnx, a refractive index difference between the first and second polymer layers along the first axis is Δny. |Δnx| being at least 0.1 and |Δny| being no more than 0.04.

Embodiment 15 is the partial reflector of Embodiment 14, wherein |Δnx| is at least 0.15 and |Δny| is no more than 0.02.

Embodiment 16 is the partial reflector of Embodiment 1, further comprising a second reflection band being a second harmonic of the first reflection band.

Embodiment 17 is the partial reflector of Embodiment 16, wherein the second reflection band has an average reflectance for normally incident light polarized along the second axis between 15% and 90%.

Embodiment 18 is the partial reflector of Embodiment 16, wherein the second reflection band has an average reflectance for normally incident light polarized along the second axis between 20% and 75%.

Embodiment 19 is the partial reflector of Embodiment 16, wherein the second reflection band has an average reflectance for normally incident light polarized along the second axis between 25% and 60%.

Embodiment 20 is the partial reflector of Embodiment 16, wherein the second reflection band has a longer wavelength band edge λ4 of no more than 500 nm.

Embodiment 21 is the partial reflector of Embodiment 20, wherein λ4 is no more than 450 nm.

Embodiment 22 is the partial reflector of Embodiment 20, wherein λ4 is no more than 430 nm.

Embodiment 23 is the partial reflector of Embodiment 20, wherein λ4 is no more than 410 nm.

Embodiment 24 is the partial reflector of Embodiment 20, wherein λ4 is in a range of 400 nm to 500 nm.

Embodiment 25 is a wavelength and polarization dependent partial reflector comprising an optical stack, the optical stack comprising a plurality of optical repeat units, each optical repeat unit including first and second polymer layers, a refractive index difference between the first and second polymer layers along a first axis being Δny, a refractive index difference between the first and second polymer layers along an orthogonal second axis being Δnx, |Δnx| being at least 0.1 and |Δny| being no more than 0.04, wherein for refractive indices along the second axis, the optical repeat units have a smallest optical thickness T1 proximate a first side of the optical stack and a largest optical thickness T2 proximate an opposite second side of the optical stack, (T2−T1)/(T2+T1) being in a range of 0.05 to 0.2, T2 being at least 350 nm and no more 1250 nm.

Embodiment 26 is the partial reflector of Embodiment 25, wherein T2 is at least 355 nm.

Embodiment 27 is the partial reflector of Embodiment 25, wherein T2 is at least 360 nm.

Embodiment 28 is the partial reflector of Embodiment 25, wherein T2 is at least 375 nm.

Embodiment 29 is the partial reflector of Embodiment 25, wherein T2 is no more than 500 nm.

Embodiment 30 is the partial reflector of Embodiment 25, wherein T2 is no more than 450 nm.

Embodiment 31 is the partial reflector of Embodiment 25, wherein for wavelengths λ1<λ2<λ3, the partial reflector has a transmittance for normally incident light polarized along the first axis of at least 85% for wavelengths between λ1 and λ3, wherein the partial reflector has a first reflection band having band edges at λ2 and λ3 for normally incident light polarized along the second axis, the reflection band having an average reflectance for normally incident light polarized along the second axis between 15% and 97%, wherein (λ3−λ2)/(λ3+λ2) is in a range of 0.05 to 0.2, and λ2 is about 2 times T1 and λ3 is about 2 times T2.

Embodiment 32 is the partial reflector of Embodiment 31, wherein the average reflectance for normally incident light polarized along the second axis is between 15% and 95%.

Embodiment 33 is the partial reflector of Embodiment 31, wherein the average reflectance for normally incident light polarized along the second axis is between 15% and 90%.

Embodiment 34 is the partial reflector of Embodiment 31, wherein the average reflectance for normally incident light polarized along the second axis is between 20% and 75%.

Embodiment 35 is the partial reflector of Embodiment 31, wherein the average reflectance for normally incident light polarized along the second axis is between 25% and 60%.

Embodiment 36 is the partial reflector of Embodiment 25, wherein $|\Delta nx|$ is at least 0.15 and $|\Delta ny|$ is no more than 0.02.

Embodiment 37 is the partial reflector of Embodiment 25, wherein an f-ratio of the optical repeat units, or 1 minus the f-ratio, is in a range of 0.06 to 0.4.

Embodiment 38 is the partial reflector of Embodiment 25, wherein an f-ratio of the optical repeat units is in a range of 0.4 to 0.6.

Embodiment 39 is the partial reflector of Embodiment 25, wherein a total number of optical repeat units in the optical stack is in a range of 35 to 160.

Embodiment 40 is the partial reflector of Embodiment 25 being further characterized by any one of Embodiments 1 to 24.

Embodiment 41 is a circular polarizer comprising:

a linear absorbing polarizer, a retarder, and the partial reflector of any one of Embodiments 1 to 40 disposed between the linear absorbing polarizer and the retarder.

Embodiment 42 is a circular polarizer comprising:

a linear absorbing polarizer;

a retarder; and a reflective polarizer disposed between the linear absorbing polarizer and the retarder, wherein the reflective polarizer has a primary reflection band having a shorter wavelength band edge at a wavelength of at least 600 nm.

Embodiment 43 is the circular polarizer of Embodiment 42, wherein the primary reflection band has a longer wavelength band edge of at least 700 nm.

Embodiment 44 is the circular polarizer of Embodiment 42, wherein the primary reflection band has a longer wavelength band edge of at least 710 nm and no more than 2500 nm.

Embodiment 45 is the circular polarizer of Embodiment 42, wherein a second harmonic of the primary reflection band has a longer wavelength band edge of no more than 500 nm.

Embodiment 46 is the circular polarizer of Embodiment 42, wherein a second harmonic of the primary reflection band has a longer wavelength band edge of no more than 450 nm.

Embodiment 47 is the circular polarizer of Embodiment 42, wherein a second harmonic of the primary reflection band has a longer wavelength band edge of no more than 430 nm.

Embodiment 48 is the circular polarizer of Embodiment 42, wherein a second harmonic of the primary reflection band has a longer wavelength band edge of no more than 410 nm.

Embodiment 49 is the circular polarizer of Embodiment 42, wherein a second harmonic of the primary reflection band has a longer wavelength band edge in a range of 400 nm to 500 nm.

Embodiment 50 is a circular polarizer comprising:

a linear absorbing polarizer;

a retarder; and a reflective polarizer disposed between the linear absorbing polarizer and the retarder, the reflective polarizer comprising an optical stack, the optical stack comprising a plurality of optical repeat units, each optical repeat unit including first and second polymer layers, wherein a refractive index difference between the first and second polymer layers along a first axis is $\Delta ny$, a refractive index difference between the first and second polymer layers along an orthogonal second axis is $\Delta nx$, $|\Delta nx|$ being at least 0.1 and $|\Delta ny|$ being no more than 0.04.

wherein for refractive indices along the second axis, the optical repeat units have a smallest optical thickness T1 proximate a first side of the optical stack and a largest optical thickness T2 proximate an opposite second side of the optical stack, and wherein T2 is at least 300 nm.

Embodiment 51 is the circular polarizer of Embodiment 50, wherein T2 is at least 350 nm.

Embodiment 52 is the circular polarizer of Embodiment 50, wherein T2 is at least 355 nm and no more 1250 nm.

Embodiment 53 is the circular polarizer of Embodiment 50, further comprising an optically thick layer disposed between the linear absorbing polarizer and the optical stack.

Embodiment 54 is the circular polarizer of any one of Embodiments 42 to 53, wherein the reflective polarizer is a partial reflector according to any one of Embodiments 1 to 40.

Embodiment 55 is the circular polarizer of any one of Embodiments 41 to 54, wherein the linear absorbing polarizer has a pass axis substantially aligned with the first axis.

Embodiment 56 is the circular polarizer of Embodiment 55, wherein an angle between the pass axis and the first axis is less than 10 degrees.

Embodiment 57 is the circular polarizer of Embodiment 55, wherein the retarder has a fast axis making an oblique angle with the pass axis of the linear absorbing polarizer.

Embodiment 58 is the circular polarizer of Embodiment 57, wherein the oblique angle is between 40 and 50 degrees.

Embodiment 59 is the circular polarizer of any one of Embodiments 41 to 54, wherein the retarder comprises a plurality of retarder layers.

Embodiment 60 is the circular polarizer of Embodiment 59, wherein a first retarder layer in the plurality of retarder layers has a first fast axis and a second retarder layer in the plurality of retarder layers has a second fast axis.

Embodiment 61 is the circular polarizer of Embodiment 60, wherein the first and second fast axes are not parallel.

Embodiment 62 is the circular polarizer of any one of Embodiments 41 to 54, wherein for at least one wavelength in a range from 400 nm to 700 nm, the retarder has a retardance of one fourth of the wavelength.

Embodiment 63 is a display comprising an organic light emitting diode display panel and the circular polarizer of any one of Embodiments 41 to 62 disposed proximate the display panel.

Embodiment 64 is a display comprising:

an organic light emitting diode display panel having an emission spectra comprising first, second and third peak emission wavelengths $\lambda a$, $\lambda a$ and $\lambda b$ satisfying $\lambda a<\lambda b<\lambda c$;

a circular polarizer disposed proximate the display panel, the circular polarizer comprising a linear absorbing polarizer, a retarder disposed between the linear absorbing polarizer and the display panel, and a reflective polarizer disposed between the linear absorbing polarizer and the retarder, wherein the reflective polarizer has a transmittance for normally incident light polarized along a pass axis of the reflective polarizer of at least of at least 85% for wavelengths between λa and λc, and a transmittance for normally incident light polarized along a block axis of the reflective polarizer of at least of at least 85% for wavelengths between ½(λa+λb) and ½(λb+λc), and wherein for a wavelength λ3>λc and a wavelength λ2 satisfying ½(λb+λc)<λ2<3, the reflective polarizer has a first reflection band having band edges at λ2 and λ3 for normally incident light polarized along the block axis, the first reflection band having an average reflectance for normally incident light polarized along the block axis between 15% and 97%.

Embodiment 65 is the display of Embodiment 64, wherein the first reflection band is a primary reflection band.

Embodiment 66 is the display of Embodiment 65, wherein reflective polarizer has a second reflection band being a second harmonic of the primary reflection band, the second reflection band having a wavelength range that includes 400 nm.

Embodiment 67 is a display comprising:

an organic light emitting diode display panel having an emission spectra comprising first, second and third peak emission wavelengths λa, λa and λb satisfying λa<λb<Δc;

a circular polarizer disposed proximate the display panel, the circular polarizer comprising a linear absorbing polarizer, a retarder disposed between the linear absorbing polarizer and the display panel, and a reflective polarizer disposed between the linear absorbing polarizer and the retarder.

wherein the reflective polarizer has a transmittance for normally incident light polarized along a pass axis of the reflective polarizer of at least of at least 85% for wavelengths between λa and λc, and a transmittance for normally incident light polarized along a block axis of the reflective polarizer of at least of at least 85% for wavelengths between ½(λa+λb) and ½(λb+λc), and wherein for a wavelength λ3>λc and a wavelength λ2 satisfying ½(λb+λc)<λ2<λ3, the reflective polarizer has a primary reflection band having band edges at λ2 and λ3 for normally incident light polarized along the block axis.

Embodiment 68 is the display of Embodiment 67, wherein the primary reflection band has an average reflectance for normally incident light polarized along the block axis between 15% and 97%.

Embodiment 69 is the display of Embodiment 67, wherein reflective polarizer has a second reflection band being a second harmonic of the primary reflection band, the second reflection band having a wavelength range that includes 400 nm.

Embodiment 70 is the display of any one of Embodiments 64 to 69, wherein the transmittance for normally incident light polarized along the block axis of the reflective polarizer is at least 80% for wavelengths between λa and λc.

Embodiment 71 is the display of any one of Embodiments 64 to 69, wherein the transmittance for normally incident light polarized along the block axis of the reflective polarizer is at least 85% for wavelengths between λa and λc.

Embodiment 72 is the display of any one of Embodiments 64 to 69, wherein λ3<2λa.

Embodiment 73 is the display of any one of Embodiments 64 to 69, wherein λa+λb≥λ3≥2 λa.

Embodiment 74 is the display of any one of Embodiments 64 to 69, wherein the reflective polarizer comprises an optical stack, the optical stack comprising a plurality of optical repeat units, each optical repeat unit including first and second polymer layers, wherein for a wavelength λ1<λa, the transmittance of the reflective polarizer for normally incident light polarized along the pass axis is at least 85% for wavelengths between λ1 and λ3, wherein the reflective polarizer has an f-ratio of the optical repeat units, a refractive index difference between the first and second polymer layers along the block axis, and a total number of optical repeat units in the optical stack such that the average reflectance for normally incident light polarized along the block axis is between 15% and 95%.

Embodiment 75 is the display of Embodiment 74, wherein the average reflectance for normally incident light polarized along the block axis is between 15% and 90%.

Embodiment 76 is the display of Embodiment 74, wherein the average reflectance for normally incident light polarized along the block axis is between 20% and 85%.

Embodiment 77 is the display of any one of Embodiments 64 to 69, wherein for refractive indices along the second axis, the optical repeat units have a range of optical thicknesses such that (λ3−λ2)/(λ3+λ2) is in a range of 0.05 to 0.2.

Embodiment 78 is the display of any one of Embodiments 64 to 69, wherein the reflective polarizer is adapted to provide a gain of at least 1.15 for wavelengths between λc and 700 nm at a view angle of 45 degrees, and to provide a gain of between 1.00 and 1.05 at the wavelength λc at a view angle of zero degrees.

Embodiment 79 is the display of Embodiment 78, wherein the reflective polarizer is adapted to provide a gain for wavelengths between λc and 700 nm at a view angle of 30 degrees that is less than the gain for wavelengths between λc and 700 nm at a view angle of 45 degrees.

Embodiment 80 is the display of any one of Embodiments 64 to 69, wherein the reflective polarizer is a partial reflector according to any one of Embodiments 1 to 40.

Embodiment 81 is the display of any one of Embodiments 64 to 69, wherein the circular polarizer is further characterized by any one of Embodiments 41 to 62.

Embodiment 82 is the display of any one of Embodiments 64 to 81 having a Δu'v' color shift at a view angle of 45 degrees that is no more than 0.8 times that of an otherwise equivalent display not including the reflective polarizer.

Embodiment 83 is the display of any one of Embodiments 64 to 81 having a Δu'v' color shift at a view angle of 45 degrees that is no more than 0.5 times that of an otherwise equivalent display not including the reflective polarizer.

Embodiment 84 is a display comprising:

an organic light emitting diode display panel; and a circular polarizer disposed proximate the display panel, the circular polarizer comprising a linear absorbing polarizer, a retarder disposed between the linear absorbing polarizer and the display panel, and a wavelength and polarization dependent partial reflector disposed between the linear absorbing polarizer and the retarder, wherein the partial reflector is a color-correcting partial reflector such that the display has a Δu'v' color shift at a view angle of 45 degrees that is no more than 0.8 times that of an otherwise equivalent display having an otherwise equivalent circular polarizer not including the partial reflector.

Embodiment 85 is the display of Embodiment 84, wherein the partial reflector comprises an optical stack, the optical stack comprising a plurality of optical repeat units, each optical repeat unit including first and second polymer layers, wherein for wavelengths λ1 in a range of 400 nm to 450 nm, λ2 in a range of 600 nm to 700 nm, and λ3 in a range of 720 nm to 900 nm, the partial reflector has a transmittance for normally incident light polarized along a first axis of at least 85% for wavelengths between λ1 and λ3.

wherein the partial reflector has a first reflection band having band edges at λ2 and λ3 for normally incident light polarized along an orthogonal second axis at normal incidence, the partial reflector having an f-ratio of the optical repeat units, a refractive index difference between the first and second polymer layers along the second axis, and a total number of optical repeat units in the optical stack such that the first reflection band has an average reflectance for light polarized along the second axis at normal incidence of between 15% and 97%, and wherein the optical repeat units have a range of optical thicknesses such that (λ3−λ2)/(λ3+λ2) is in a range of 0.05 to 0.2.

Embodiment 86 is the display of Embodiment 85, wherein the first reflection band is a primary reflection band.

Embodiment 87 is the display of Embodiment 86, wherein the partial reflector has a second reflection band being a second harmonic of the primary reflection band, the second reflection band having a wavelength range that includes 400 nm.

Embodiment 88 is the display of Embodiment 85, wherein the average reflectance for light polarized along the second axis at normal incidence is between 15% and 95%.

Embodiment 89 is the display of Embodiment 85, wherein the average reflectance for light polarized along the second axis at normal incidence is between 15% and 90%.

Embodiment 90 is the display of Embodiment 85, wherein the average reflectance for light polarized along the second axis at normal incidence is between 20% and 85%.

Embodiment 91 is the display of Embodiment 85, wherein the average reflectance for light polarized along the second axis at normal incidence is between 20% and 75%.

Embodiment 92 is the display of Embodiment 85, wherein the average reflectance for light polarized along the second axis at normal incidence is between 25% and 60%.

Embodiment 93 is the display of Embodiment 84, wherein the Δu'v' color shift at a view angle of 45 degrees is no more than 0.5 times that of the otherwise equivalent display.

Embodiment 94 is the display of Embodiment 84, wherein the partial reflector is adapted to provide a gain for wavelengths between 620 nm and 700 nm at a view angle of 30 degrees that is less than a gain for wavelengths between 620 nm and 700 nm at a view angle of 45 degrees.

Embodiment 95 is the display of Embodiment 84, wherein the partial reflector is further characterized by any one of Embodiments 1 to 40.

Embodiment 96 is the display of Embodiment 84, wherein the circular polarizer is further characterized by any one of Embodiments 41 to 62.

EXAMPLES

Birefringent multilayer optical films with controlled band edges and tailored reflectivity with angle were made using generally known film processes for creating multilayer films and rolls of the films. The Examples described herein include differing multilayer optical films which were made, generally, of first optical layers (made of 90/10 coPEN) and second optical layers (made of a blend of 90/10 coPEN and PETG) which were fed from separate extruders into a multilayer coextrusion feedblock and cast through a film die onto a chill roll to form large number of alternating layers. PETG is a copolyester available from Eastman Chemicals (Knoxville, TN). 90/10 CoPEN is a random copolyester that is 90 mol % polyethylene naphthalate and 10 mol % polyethylene terephthalate, produced by 3M Corporation, Saint Paul, MN. Variations of layer number, draw ratio details are reported in the following Examples.

After fabrication of the birefringent multilayer optical film stacks, the Examples were subsequently combined with an absorptive polarizer (AP) on one major surface and a quarter wave plate (QWP) on the opposite major surface to form a functional optical stack which can be useful as a color correcting circular polarizer, for example. This optical stack was incorporated for some measurements into commercial devices by way of replacement of the circular polarizer that is typically incorporated in the device.

Test Methods

Emissive luminance and color were measured via a PR-740 Spectrophotometer from Photo Research Inc with results reported by convention of CIE color chart coordinates. Reflection and transmission spectra were measured via Lambda 900 Spectrometer from Perkin-Elmer Inc for both polarization block (crossed) and pass (aligned) states. The bi-directional scatter distribution functions (BRDFs) were measured for each sample at select incidence angles using a Radiant Vision Systems IS-SA Imaging Sphere.

Example 1

Figure 15:
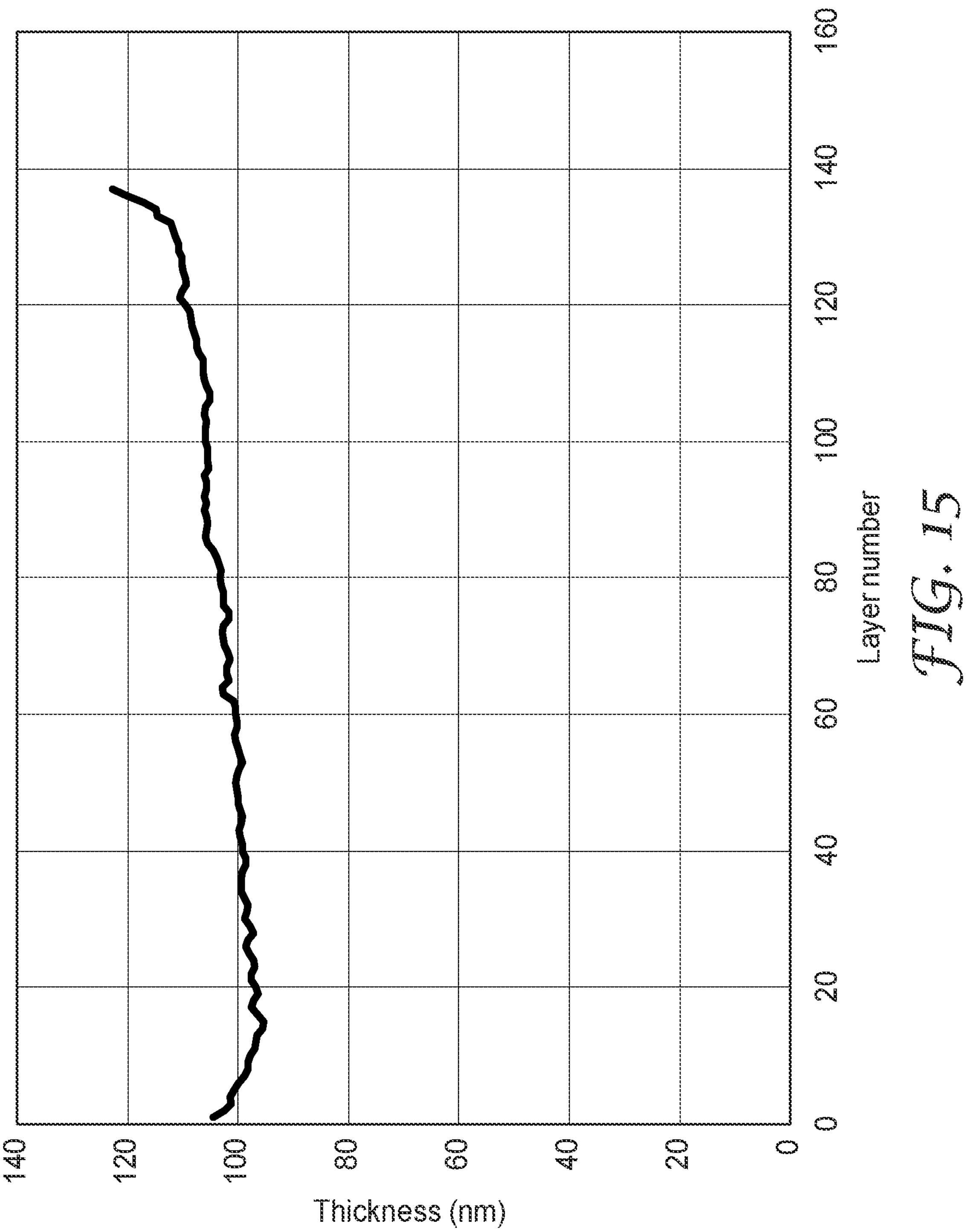
FIG. 15 is a plot of the layer thickness profile for the reflective polarizer of Example 1.
Figure 16:
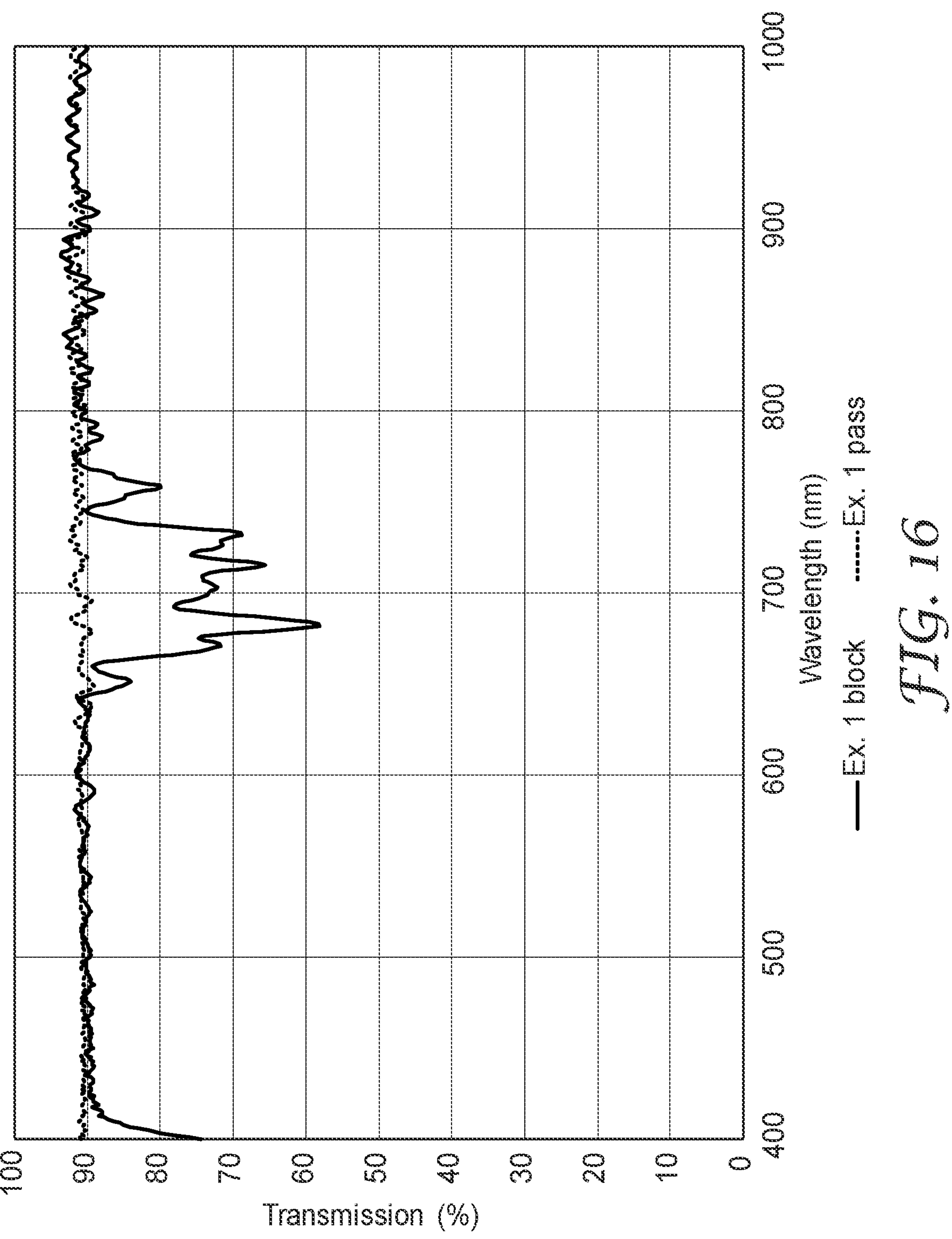
FIG. 16 is a plot of the transmission spectra of the reflective polarizer of Example 1.

A birefringent reflective polarizer was prepared as follows. Two polymers were used for the optical layers. The first polymer (first optical layers) was 90/10 coPEN, a polymer composed of 90% polyethylene naphthalate (PEN) and 10% polyethylene terephthalate (PET). The second polymer (second optical layers) was a blend of a first polyethylene naphthalate copolymer (coPEN) having 90 mol % naphthalate and 10 mol % and a copolyesters such as Polyethylene Terephthalate Glycol (PETG) at a ratio of approximately 45 mol % 90/10 PEN to 55 mol % PETG where the second optical layer material Tg is approximately 97-100 degrees centigrade. The ratio of the feed rate of the first polymer to the second polymer was 8:92 for this Example; the f-ratio in this case was 0.10. The polymer used for the skin layers was PETG. The materials were fed from separate extruders to a multilayer coextrusion feedblock, in which they were assembled into a packet of 137 alternating optical layers, plus a thicker protective boundary layer of the second optical layers, on each side, for a total of 139 layers. The skin layers of the second optical layer material were added to the construction in a manifold specific to that purpose, resulting in a final construction having 141 layers. The multilayer melt was then cast through a film die onto a chill roll, in the conventional manner for polyester films, upon which it was quenched. The cast web was then stretched in a commercial scale linear tenter at a draw ratio approximately 6:1 and a temperature of 280° F. The layer thickness profile is shown in FIG. 15 and the resulting total thickness was measured by capacitance gauge to be approximately 25 μm.

The resulting multilayer optical film of Example 1 was then incorporated together with an absorbing polarizer on one surface and a quarter-wave plate on the other surface to form a circular polarizer (labelled Ex1-CP). An absorbing polarizer 5618 H-type from Sanritz was laminated to the film of Example 1 where the block axes were substantially aligned. On the opposite side of the film of Example 1 a quarter wave plate (QWP) with trade name APQW92-004-PC-140NMHE from American Polarizers, Inc., Reading, PA was laminated with 8171 optically clear adhesive from 3M Company. The QWP optical axis was approximately 45 degrees relative to the block axis of the polarizers. The resulting circular polarizer (Ex1-CP) was then laminated to an Apple Watch 1, where the original circular polarizer had been removed from the display.

Example 2

Figure 17:
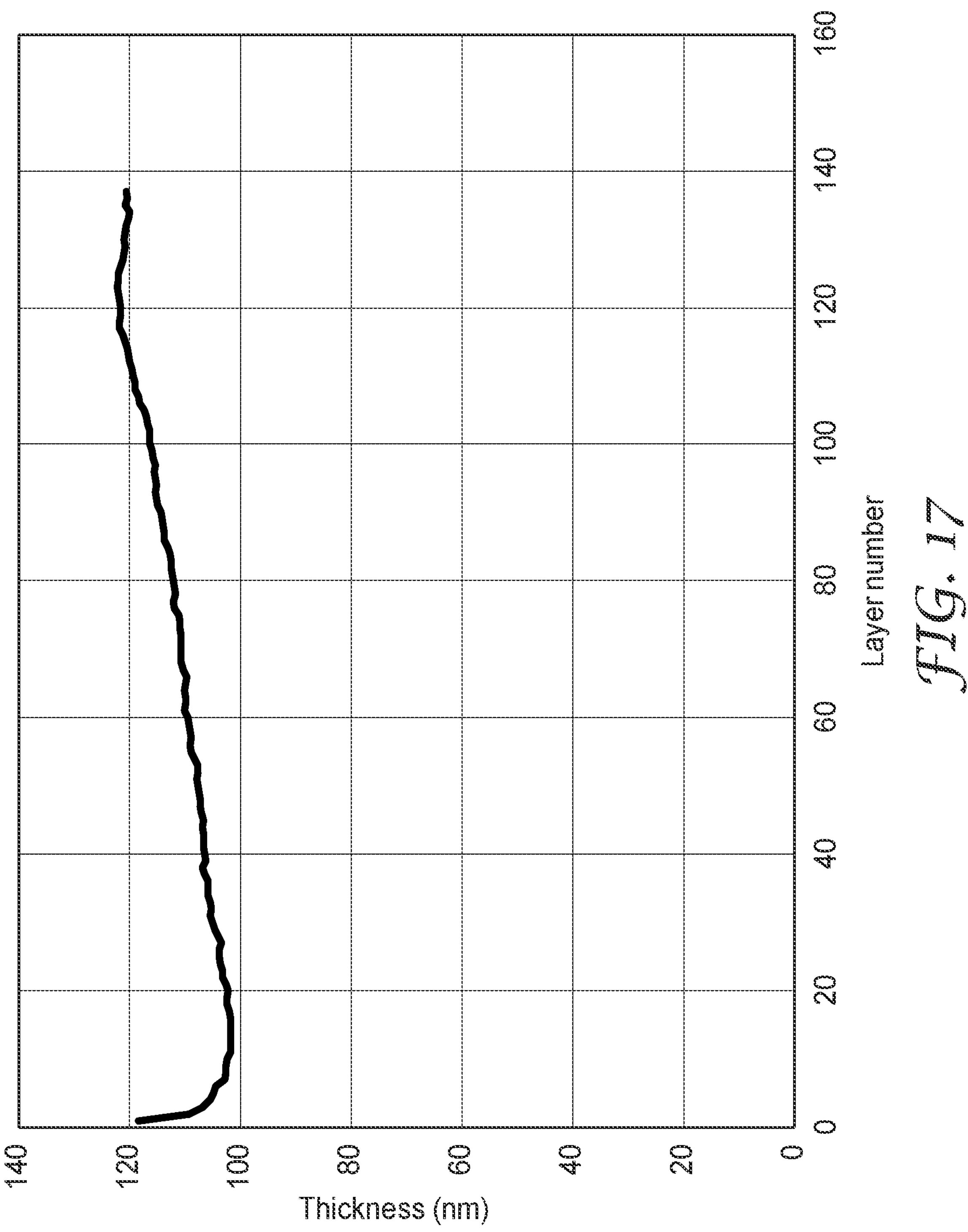
FIG. 17 is a plot of the layer thickness profile for the reflective polarizer of Example 2.
Figure 18:
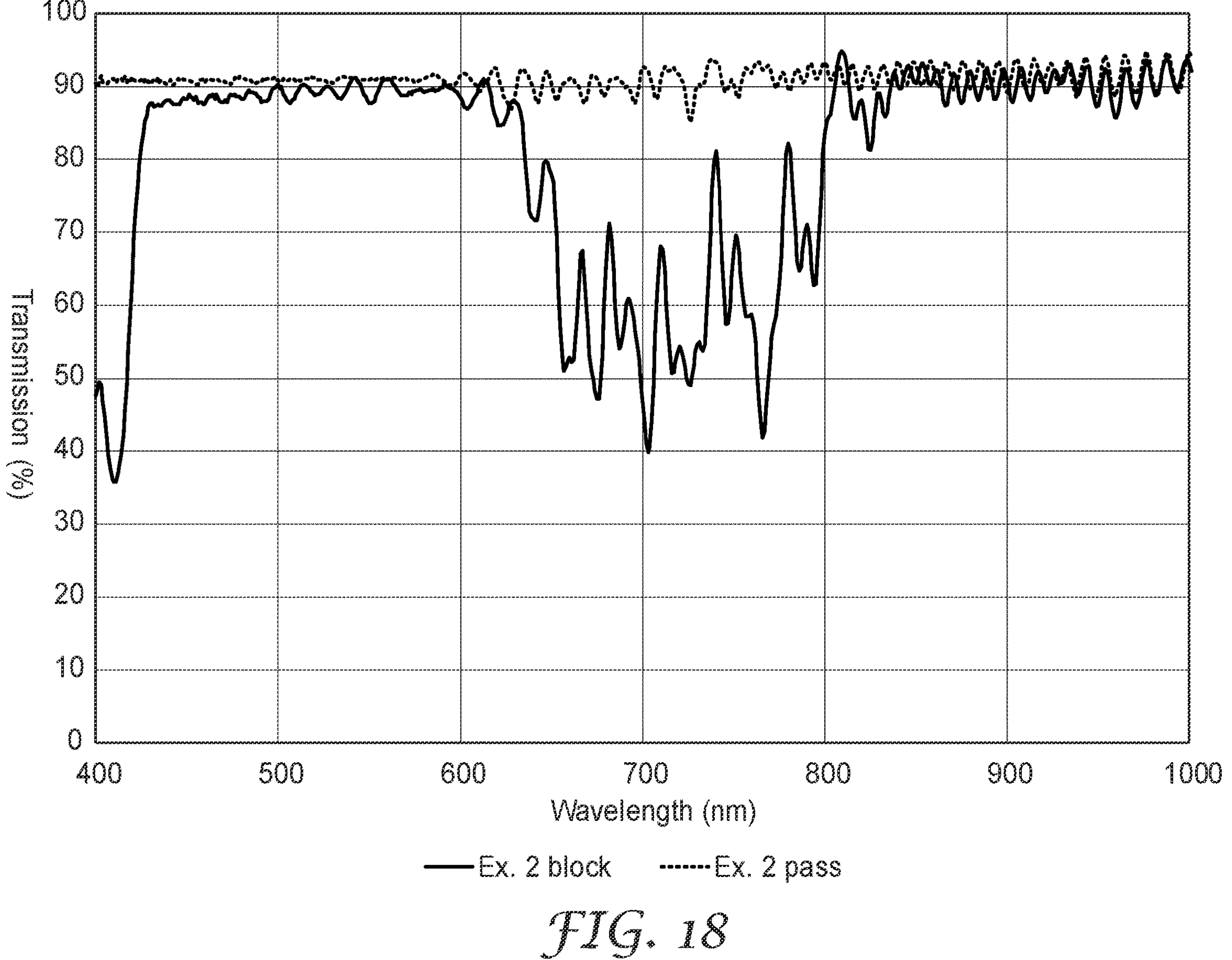
FIG. 18 is a plot of the transmission spectra of the reflective polarizer of Example 2.

As specified above for Example 1, a birefringent reflective polarizer was prepared with alternating layers of first polymer (90/10 coPEN) and second polymer (blended coPEN/PETG). The ratio of the feed rate of the first polymer to the second polymer for Example 2 was 9:91; the f-ratio in this case was 0.12. Also, like Example 1, the polymer used for the skin layers was PETG and the resulting final construction with skin layers was 141 layers and the resulting physical thickness as measured by a capacitance gauge of approximately 26.6 μm. The layer thickness profile is shown in FIG. 17.

Like Example 1, Example 2 was incorporated together with an absorbing polarizer (5618 H-type from Sanritz) on one surface and a quarter-wave plate (APQW92-004-PC-140NMHE from American Polarizers) on the other surface to form a circular polarizer (labelled Ex2-CP). The circular polarizer Ex2-CP was then laminated to an Apple Watch 1.0, where the original circular polarizer had been removed from the display.

Example 3

Figure 22:
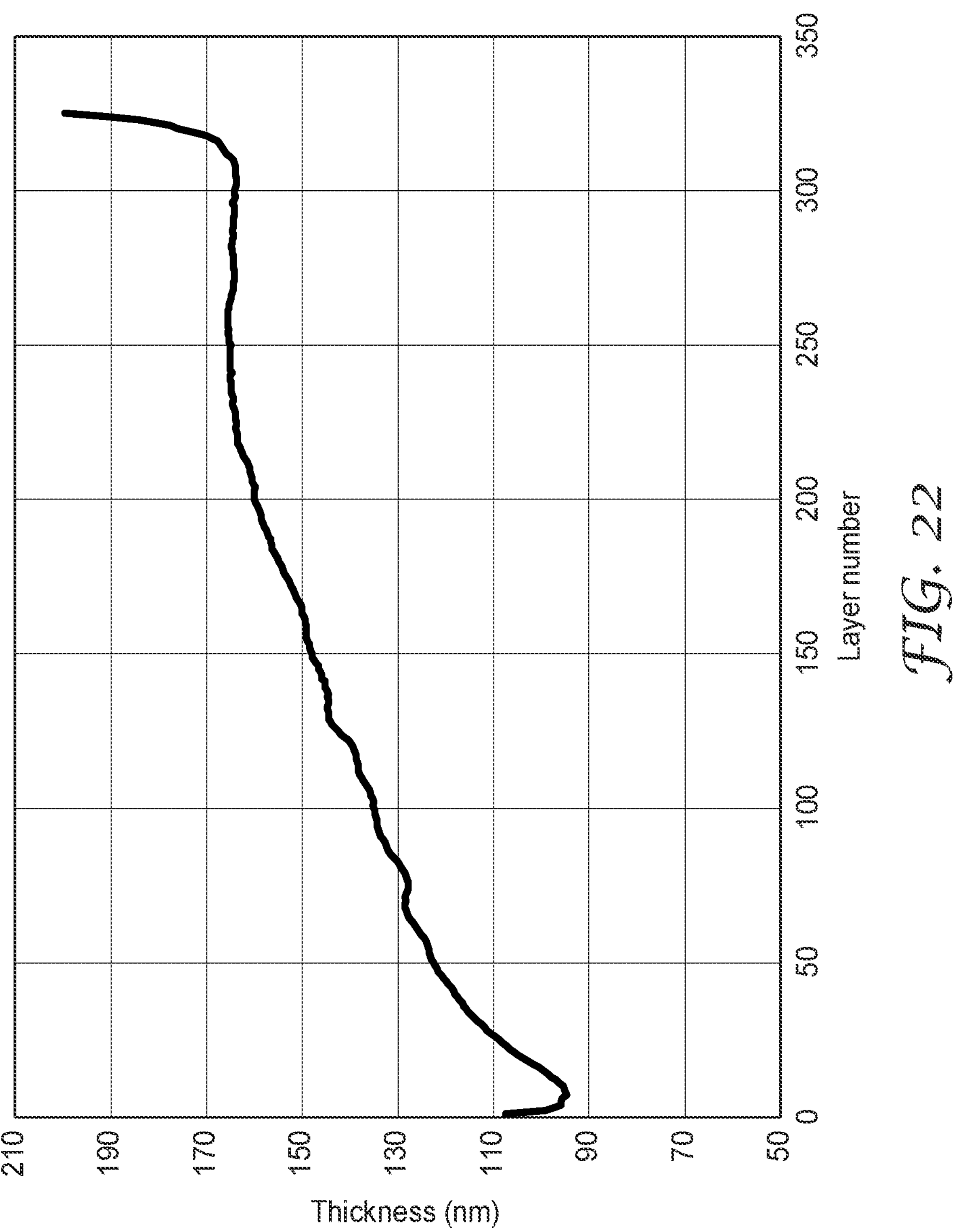
FIG. 22 is a plot of the layer thickness profile for the reflective polarizer of Example 3.
Figure 23:
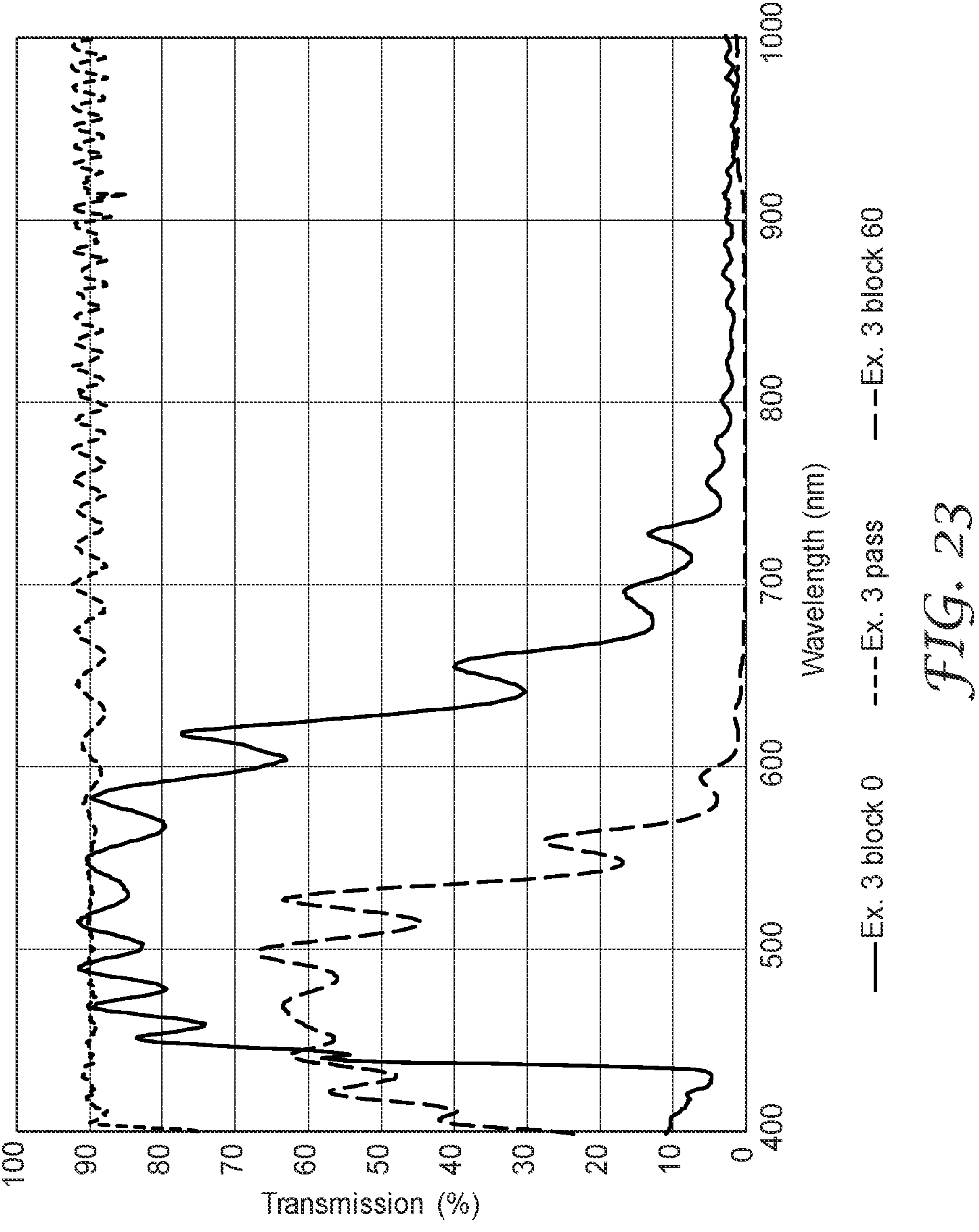
FIG. 23 is a plot of the transmission spectra of the reflective polarizer of Example 3 for the pass polarization state at normal incidence and for the block polarization state at normal incidence and at an angle of incidence of 60 degrees.

Example 3 was prepared as follows. A single multilayer optical packet was co-extruded comprised of 325 alternating layers of 90/10 coPEN, a polymer composed of 90% polyethylene naphthalate (PEN) and 10% polyethylene terephthalate (PET), and a low index isotropic layer, which was made with a blend of polycarbonate and copolyesters (PC:coPET) as described in WO2015035030 such that the index is about 1.57 and remains substantially isotropic upon uniaxial orientation. The PC:coPET molar ratio is approximately 42.5 mol % PC and 57.5 mol % coPET and has a Tg of 105 degrees centigrade. This isotropic material is chosen such that after stretching its refractive indices in the two non-stretch directions remains substantially matched with those of the birefringent material in the non-stretching direction while in the stretching direction there is a substantial mis-match in refractive indices between birefringent and non-birefringent layers. The 90/10 PEN and PC:coPET polymers were fed from separate extruders at a target f-ratio of approximately 0.5 to a multilayer coextrusion feedblock, in which they were assembled into a packet of 325 alternating optical layers, plus a thicker protective boundary layer of the PC:coPET, on each side, for a total of 327 layers. The multilayer melt was then cast through a film die onto a chill roll, in the conventional manner for polyester films, upon which it was quenched. The cast web was then stretched in a parabolic tenter similar to that described in the Invited Paper 45.1, authored by Denker et al., entitled "Advanced Polarizer Film for Improved Performance of Liquid Crystal Displays." presented at Society for Information Displays (SID) International Conference in San Francisco, Calif., Jun. 4-9, 2006. The layer thickness profile is shown in FIG. 22. This film has a resulting physical thickness as measured by a capacitance gauge of approximately 53.3 μm.

Like previous Examples, Example 3 was incorporated together with an absorbing polarizer (5618 H-type from Sanritz) on one surface and a quarter-wave plate (APQW92-004-PC-140NMHE from American Polarizers) on the other surface to form a circular polarizer (labelled Ex3-CP). The circular polarizer Ex3-CP was then laminated to an Apple Watch 1.0, where the original circular polarizer had been removed from the display.

Example 4

Example 4 was prepared in a similar way to Example 3, with parabolic tentering and f-ratio of 0.5, but the process was adjusted to change the thickness to 55.4 μm and create a higher wavelength reflection band.

Like previous Examples, Example 4 was incorporated together with an absorbing polarizer (5618 H-type from Sanritz) on one surface and a quarter-wave plate (APQW92-004-PC-140NMHE from American Polarizers) on the other surface to form a circular polarizer (labelled Ex4-CP). The circular polarizer Ex4-CP was then laminated to an Apple Watch 1.0, where the original circular polarizer had been removed from the display.

Example 5

Example 5 was prepared in a similar way to Example 1, with linear tentering, except that the ratio of the high and low index resin thicknesses was adjusted to provide an f-ratio of approximately 0.29 and finished thickness was 25.5 micrometers.

Example 6

Example 6 was prepared in a similar manner to Example 5, except the ratio of the high and low index resin thicknesses was adjusted to provide an f-ratio of approximately 0.18. Finished thickness was 25.5 micrometers.

Example 7

A birefringent reflective polarizer was prepared as in Example 1. The resulting film was then incorporated together with an absorbing polarizer on one surface and a quarter-wave plate on the other to form a circular polarizer (labelled Ex7-CP). An absorbing polarizer 5618 H-type from Sanritz was laminated to the film of Example 7 where the block axes were substantially aligned. On the opposite side of the film of Example 7, a quarter wave plate (QWP) with trade name APQW92-004-PC-140NMHE from American Polarizers, Inc., Reading, PA was laminated with 8171 optically clear adhesive from 3M Company. The QWP optical axis was approximately 45 degrees relative to the optic axis of the polarizers. The resulting circular polarizer (Ex7-CP) was then laminated to a Samsung Galaxy 2.0, where the original circular polarizer had been removed from the display.

Example 8

A birefringent reflective polarizer was prepared as in Example 2. Similar to Example 7, the resulting film was incorporated together with an absorbing polarizer (5618

H-type from Sanritz) on one surface and a quarter-wave plate (APQW92-004-PC-140NMHE from American Polarizers) on the other surface to form a circular polarizer (labelled Ex8-CP). The circular polarizer (Ex8-CP) was then laminated to a Samsung Galaxy Tablet 2.0, where the original circular polarizer had been removed from the display.

Example 9

Example 9 was prepared in a similar manner to Example 6. The ratio of the high and low index resin thicknesses was adjusted to provide an f-ratio of approximately 0.18. Final thickness was 25.5 micrometers.

Comparative Example 1 (CE-1)

A circular polarizer was assembled by the following method. An absorbing polarizer 5618 H-type from Sanritz was laminated to a quarter wave plate (QWP) with trade name APQW92-004-PC-140NMHE from American Polarizers. Inc. Reading, PA. The QWP optical axis was approximately 45 degrees relative to the optic axis of the polarizer.

The comparative polarizer was laminated to an Apple Watch 1.0, where the original circular polarizer had been removed from the display.

Comparative Example 2 (CE-2)

This comparative example was fabricated as in Comparative Example 1 except that the resulting circular polarizer was also laminated to a Samsung Galaxy Tablet 2.0, where the original circular polarizer had been removed from the display.

Comparative Example 3 (CE-3)

Figure 28:
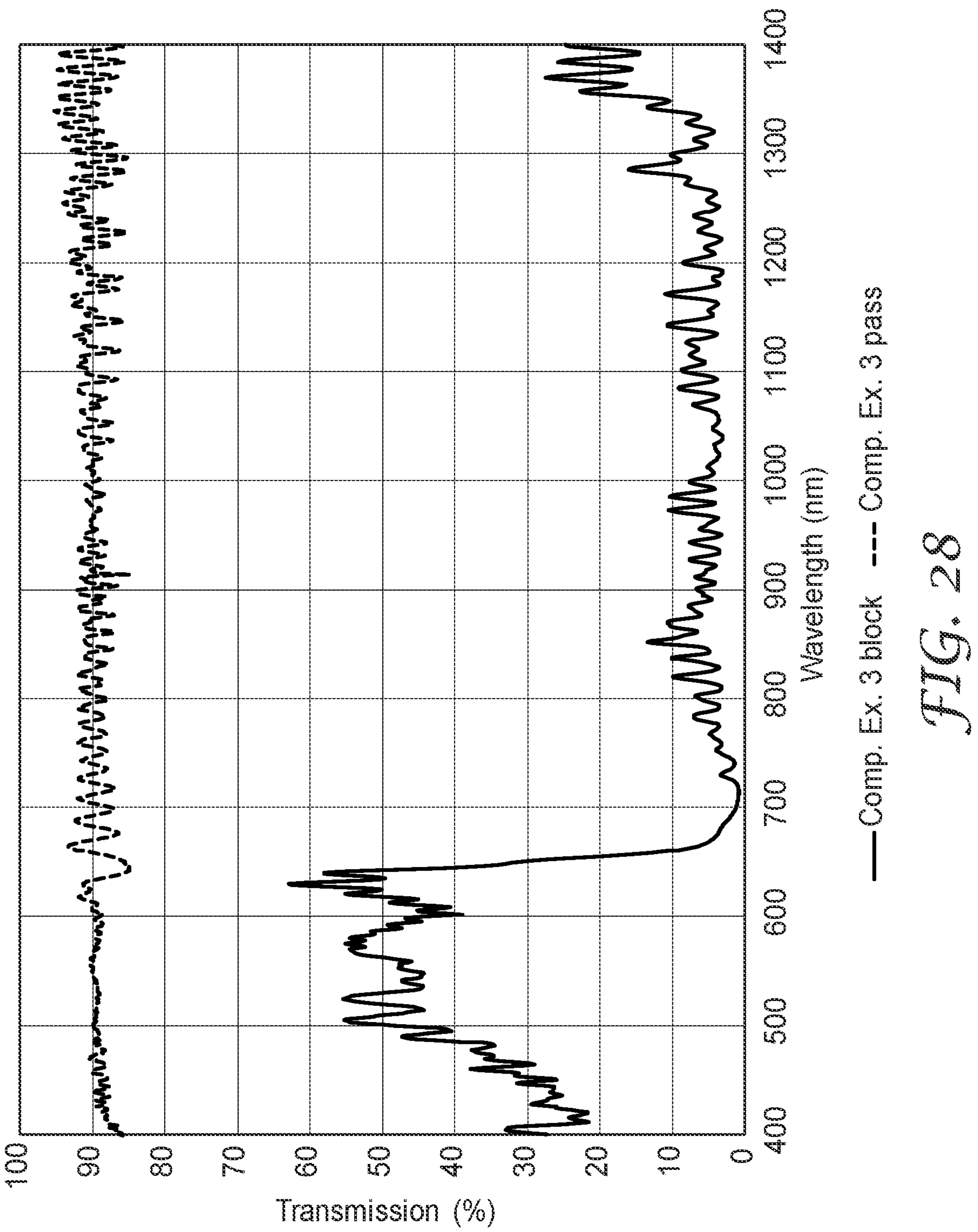
FIG. 28 is a plot of the normal incidence transmission spectra of the reflective polarizer of Comparative Example 3.

Comparative Example 3 was prepared as follows. A single multilayer optical packet was co-extruded comprised of 275 alternating layers of 90/10 coPEN, a polymer composed of 90% polyethylene naphthalate (PEN) and 10% polyethylene terephthalate (PET), and a low index isotropic layer, which was made with a blend of polycarbonate and copolyesters (PC:coPET) as described in WO2015035030 such that the index is about 1.57 and remains substantially isotropic upon uniaxial orientation. The PC:coPET molar ratio is approximately 42.5 mol % PC and 57.5 mol % coPET and has a Tg of 105 degrees centigrade. This isotropic material was chosen such that after stretching its refractive indices in the two non-stretch directions remained substantially matched with those of the birefringent material in the non-stretching direction while in the stretching direction there was a substantial mismatch in refractive indices between birefringent and non-birefringent layers. The 90/10 PEN and PC:coPET polymers were fed from separate extruders ratios of total flow of 44% and 56% for 90/10 PEN and PC:coPET respectively to a multilayer coextrusion feedblock. The materials were assembled into a packet of 275 alternating optical layers, plus a thicker protective boundary layer of the on each side of 90/10 PEN on one side and PC:coPET on the other, for a total of 277 layers. The multilayer melt was then cast through a film die onto a chill roll, in the conventional manner for polyester films, upon which it was quenched. The cast web was then stretched in a parabolic tenter similar to that described in the Invited Paper 45.1, authored by Denker et al., entitled "Advanced Polarizer Film for Improved Performance of Liquid Crystal Displays," presented at Society for Information Displays (SID) International Conference in San Francisco, Calif., Jun. 4-9, 2006. The transmission was determined and is shown in FIG. 28. This film had a resulting physical thickness as measured by a capacitance gauge of approximately 45.1 μm. The film was found to cause higher reflection at normal incidence in the visible range than desired for a color correction film when incorporated into an OLED device.

TABLE 1

Example summary for device test results in Apple Watch 1 (AW1) and Samsung Galaxy 2 (SG2) devices

| Example | Device | Thickness | Tentering | f-ratio |
|---|---|---|---|---|
| 1 | AW1 | 25.0 | Linear | 0.10 |
| 2 | AW1 | 26.6 | Linear | 0.12 |
| 3 | AW1 | 53.3 | Parabolic | 0.50 |
| 4 | AW1 | 55.4 | Parabolic | 0.50 |
| 5 | AW1 | 25.5 | Linear | 0.29 |
| 6 | AW1 | 25.5 | Linear | 0.18 |
| 7 | SG2 | 25.0 | Linear | 0.10 |
| 8 | SG2 | 26.6 | Linear | 0.12 |
| 9 | SG2 | 25.5 | Linear | 0.18 |

Test Results

It was found that the optical stacks of the Examples could be used in a display stack on an emissive display to reduce angular color shift. The optical stacks can create gain, or increased luminance for specific angles and wavelengths compared to a conventional circular polarizer. In cases where the film was a reflective polarizer placed below the absorptive polarizer, a minimal effect on ambient reflection was observed.

Figure 14:
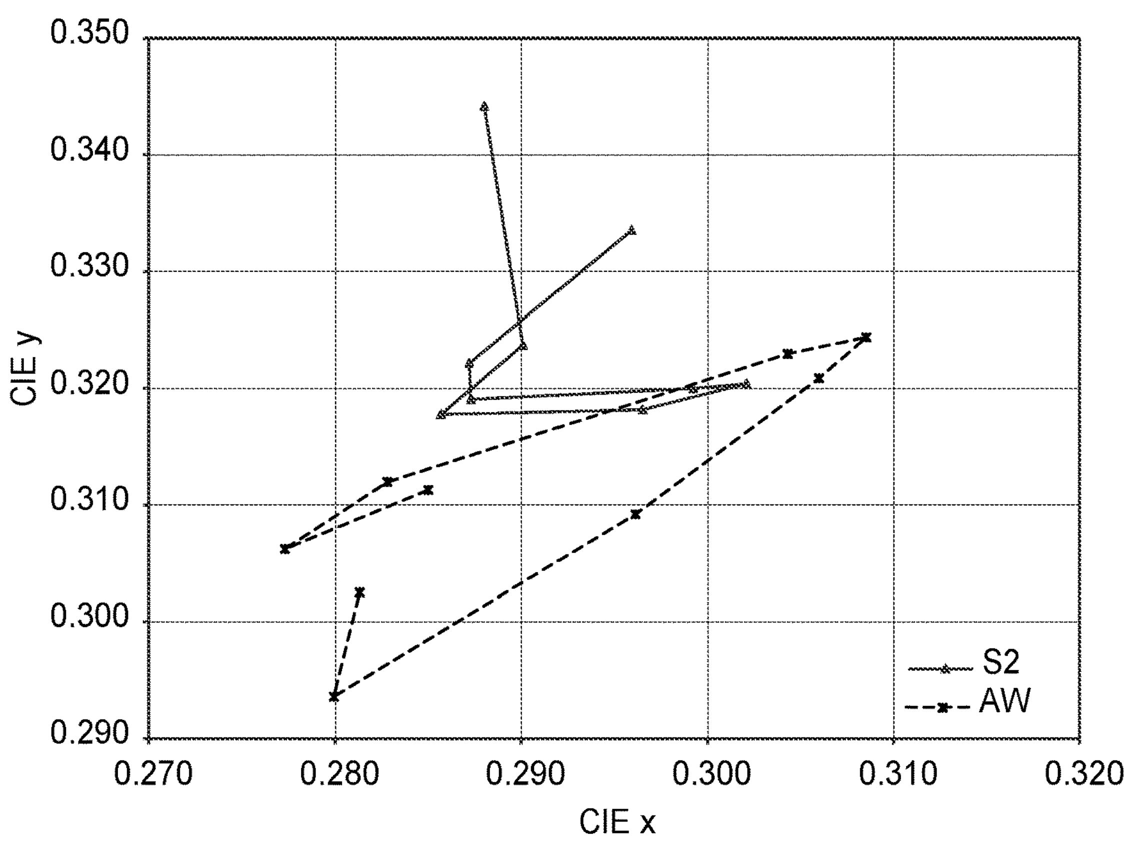
FIG. 14 is a CIE (Commission Internationale de l'Eclairage) xy color plot for −60 to 60 degree inclination angle for commercial samples of Apple Watch (AW) and Samsung Galaxy Tablet 2 (S2)

In order to measure the reductions in angular color shift, commercial OLED devices of two types were modified to incorporate Example circular polarizers. The devices we used for this comparison included an Apple Watch and a Samsung 2 Tablet. Commercial devices using strong micro-cavity OLED design exhibit a large inherent angular color shift in the white state. The color typically shifts to the blue and/or green from white. In FIG. 14, CIE xy color from −60 to 60 degrees inclination angle (view angle) is shown for commercial samples of Apple Watch (AW) and Samsung Galaxy Tablet 2 (S2). This color shift problem has been conventionally addressed by blocking some of the blue and green light. In some examples, the color shift was compensated by effectively recycling the polarized light of only desired wavelengths and angles. In some examples, the desired wavelengths were 600-650 nm at angles greater than 30 degrees.

One potential problem with using a wavelength specific reflective film to compensate a display is diffuse reflection of the backplane. While OLED backplanes are not as diffusely reflective as LCD backlights, they are still fairly diffuse. Averages for BRDFs (bi-directional scatter distribution functions) were measured for samples at select incidence angles with a Radiant Vision Systems IS-SA Imaging Sphere and are reported in Table 2 where the view angle is relative to normal, TR is Total Reflectance, and DR is diffuse reflectance. One might expect to see much of the reflected light at high angles scatter back towards normal incidence with such significant diffuse reflectance. If the diffuse reflectance is significant, reflected light would be expected scatter to all angles, creating optical gain at all angles. However, it has been found that the partial reflectors of the present description can create gain substantially more off-axis compared to on-axis.

TABLE 2

| Sample ID | View Angle (°) | TR mean | DR mean |
|---|---|---|---|
| Apple Watch OLED | 0 | 59.5% | 31.6% |
| Apple Watch OLED | 16 | 60.4% | 33.2% |
| Apple Watch OLED | 30 | 61.6% | 34.7% |
| Apple Watch OLED | 60 | 57.6% | 33.5% |
| Galaxy Tablet 2 | 0 | 49.6% | 24.5% |
| Galaxy Tablet 2 | 16 | 48.1% | 25.2% |
| Galaxy Tablet 2 | 30 | 45.5% | 23.2% |
| Galaxy Tablet 2 | 60 | 43.0% | 14.9% |

Figure 20:
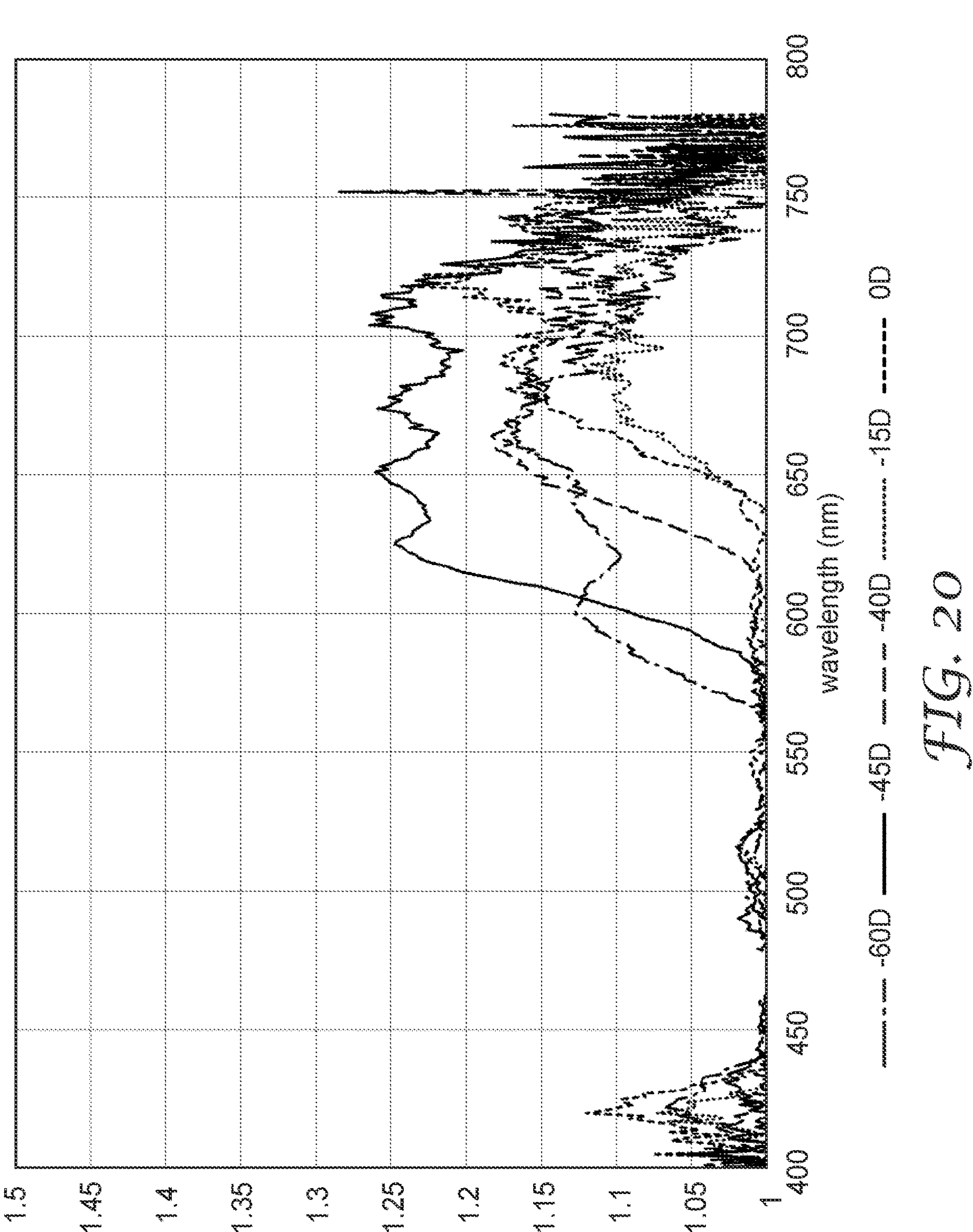
FIG. 20 is a plot of the gain of Example 8 as a function of wavelength for various view angles.
Figure 21:
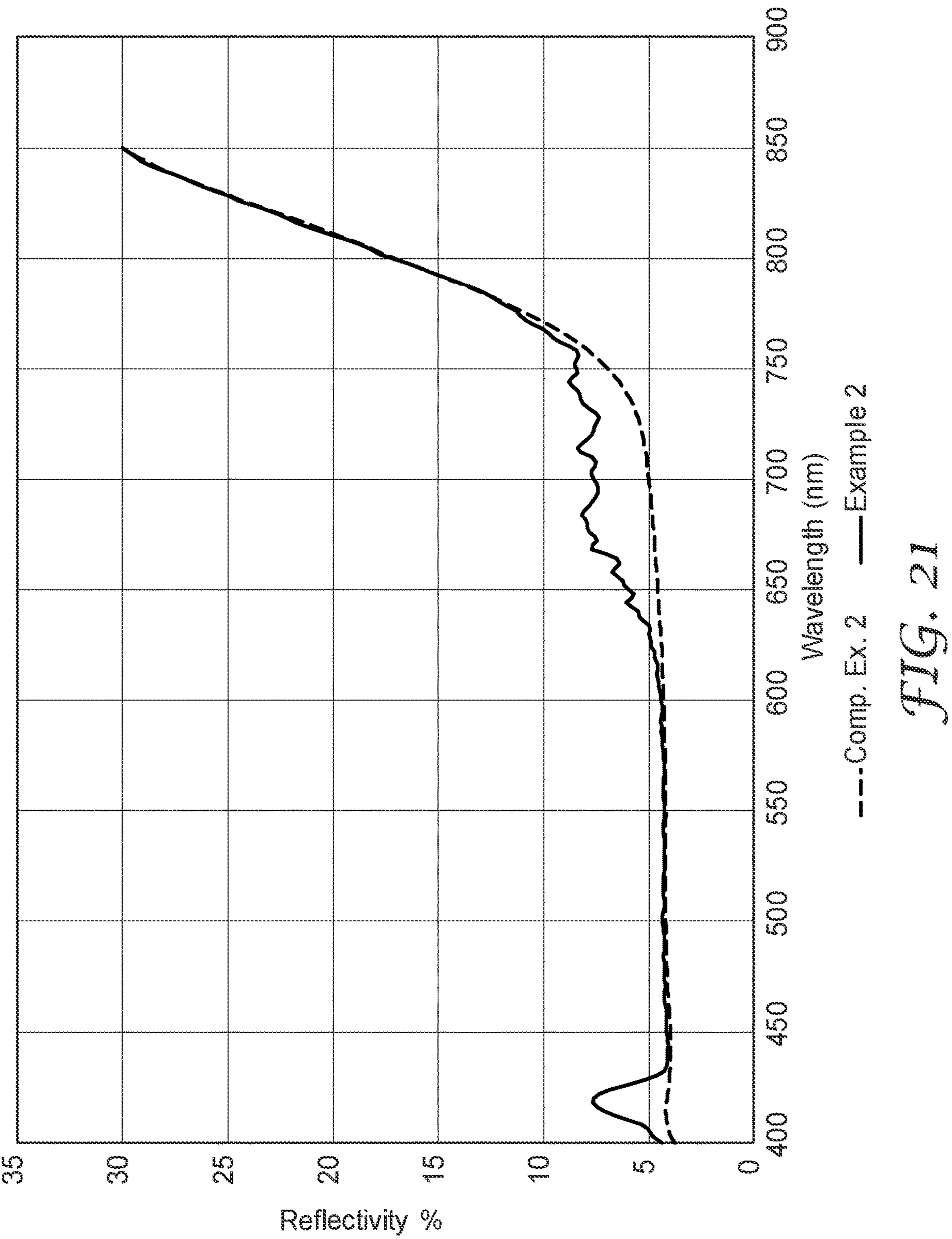
FIG. 21 is a plot of the reflectivity spectra for Example 2 and Comparative Example 2.
Figure 24:
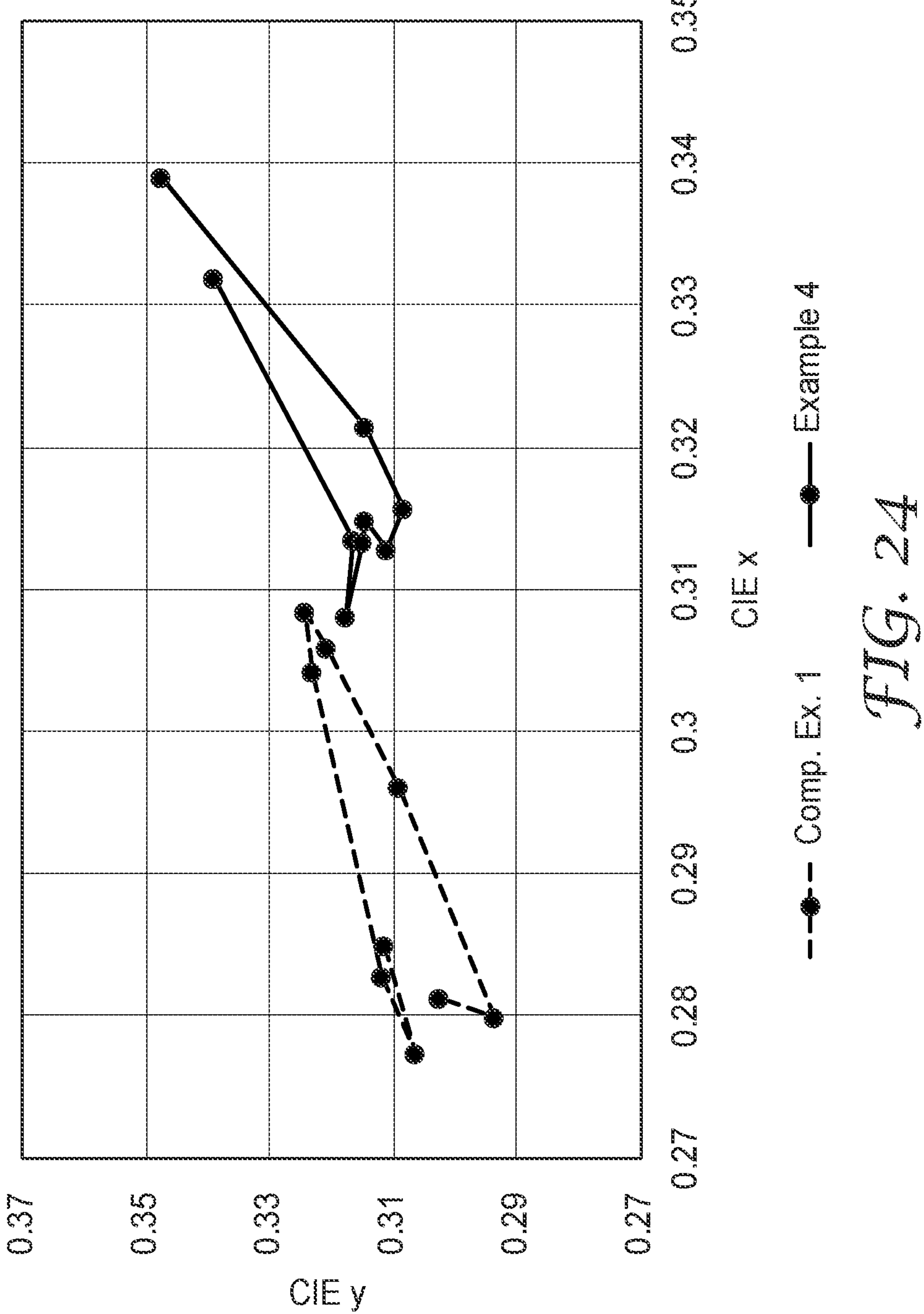
FIG. 24 is a CIE color plot for Example 4 and Comparative Example 1 for view angles from −60 degrees to 60 degrees.
Figure 25:
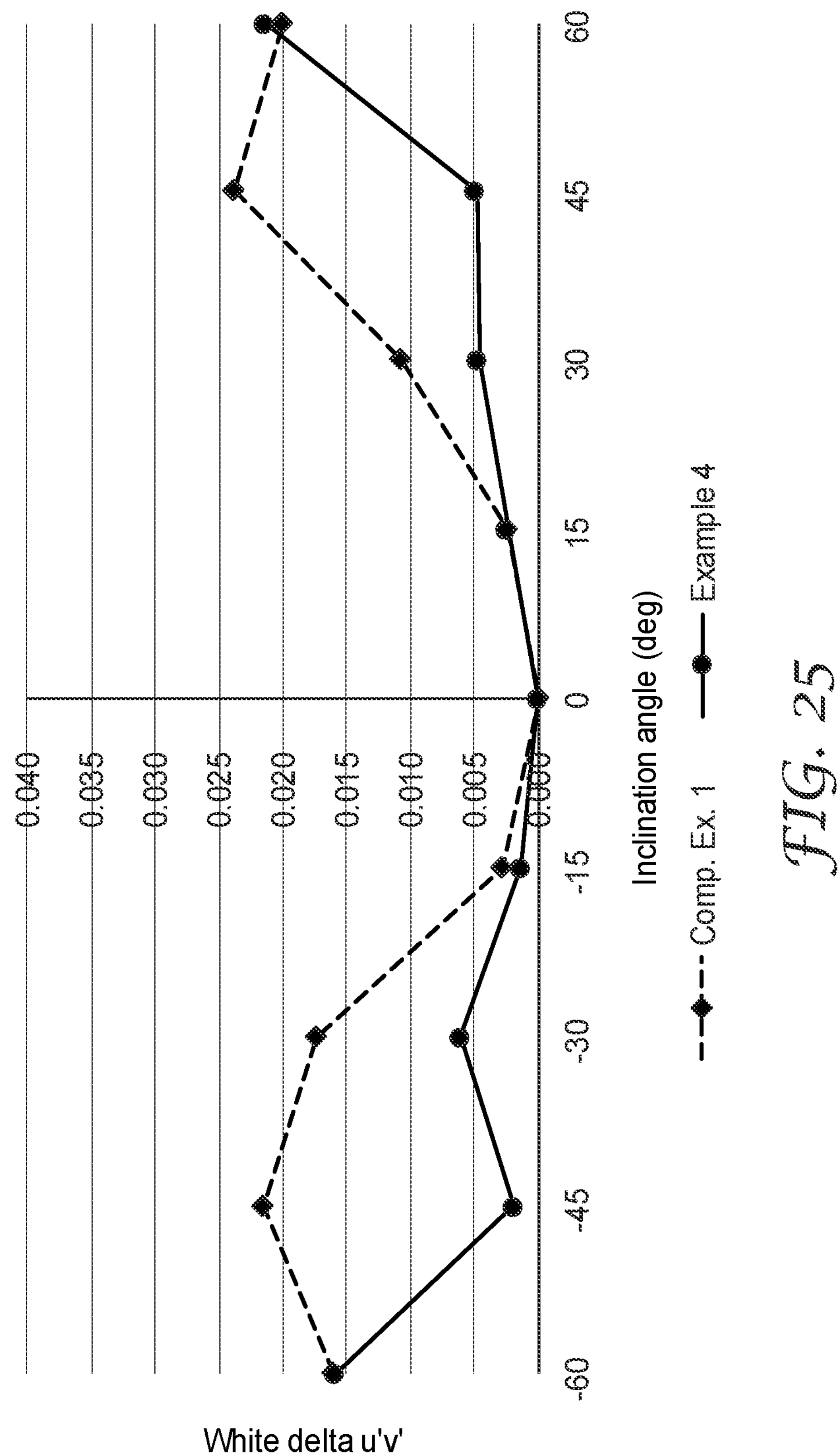
FIG. 25 is a plot of color shift versus inclination angle for Example 4 and Comparative Example 1.
Figure 26:
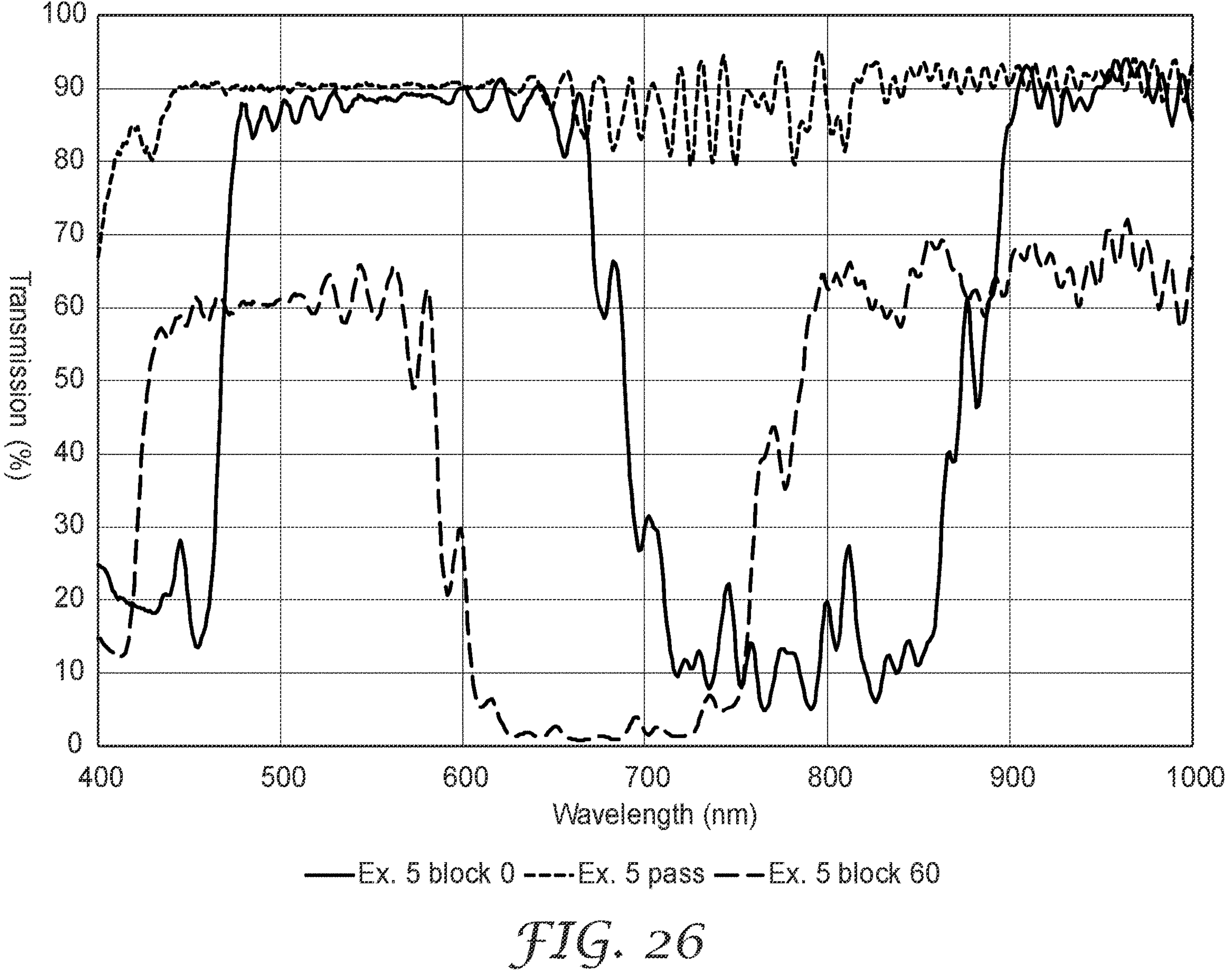
FIG. 26 is a plot of the transmission spectra of the reflective polarizer of Example 5 for the pass polarization state at normal incidence and for the block polarization state at normal incidence and at an angle of incidence of 60 degrees.
Figure 27:
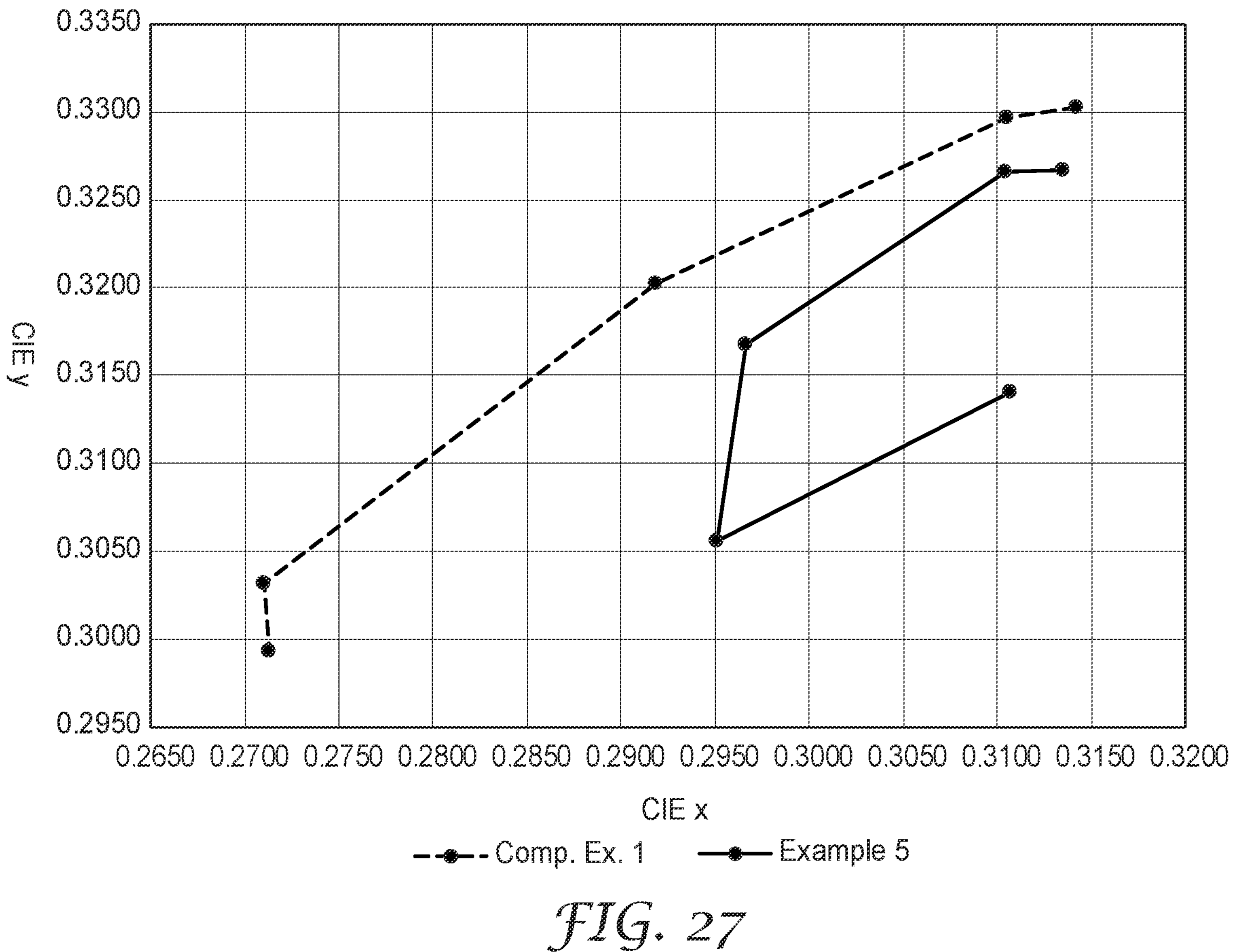
FIG. 27 is a CIE color plot for Example 5 and Comparative Example 1 for view angles from −60 degrees to 60 degrees.

Results for layer thickness profiles and pass and block state transmission spectra for Examples 1-5 are shown in FIGS. 15-19, 22-23, and 26. Example Gain and reflectivity spectra are shown in FIGS. 20 and 21, respectively, for Example 2. FIGS. 24-25 show example CIE color plot and color shift versus angle for Example 4. Summary Table of measurements for white color shift results and reflectivity for Examples and Comparative Examples are summarized in Table 3 where emissive luminance and color were measured via a PR-740 Spectrophotometer from Photo Research Inc. Reflectivity was measured via Lambda 900 Spectrometer from Perkin Elmer. Relative luminance is the luminance of the sample divided by the luminance of the indicated references. The CIE x and y values normal to the display and the Δu'v' at 45 degrees and 60 degrees relative to normal are reported.

TABLE 3

Relative luminance, color and reflectance results

| Sample | Reference and type | Relative Lum. | x | y | Δu'v' @45 | Δu'v' @60 | Reflectance % |
|---|---|---|---|---|---|---|---|
| CE-1 | n.a. | 100% | 0.3132 | 0.3301 | 0.031 | 0.030 | 4.55 |
| Example 1 | CE-1/AW1 | 105% | 0.3158 | 0.3289 | 0.023 | 0.020 | 4.82 |
| Example 2 | CE-1/AW1 | 105% | 0.3138 | 0.3275 | 0.021 | 0.015 | 4.89 |
| Example 3 | CE-1/AW1 | 109% | 0.3303 | 0.3261 | 0.015 | 0.011 | 8.62 |
| Example 4 | CE-1/AW1 | 111% | 0.3197 | 0.3223 | 0.013 | 0.005 | 5.84 |
| Example 5 | CE-1/AW1 | 104% | 0.3141 | 0.3264 | 0.015 | 0.008 | 5.38 |
| Example 6 | CE-1/AW1 | 103% | 0.3124 | 0.3269 | 0.020 | 0.011 | 4.91 |
| CE-2 | n.a. | 100% | 0.3019 | 0.3153 | 0.012 | 0.013 | 4.25 |
| Example 7 | CE-2/SG2 | 95% | 0.3022 | 0.315 | 0.005 | 0.012 | 4.61 |
| Example 8 | CE-2/SG2 | 101% | 0.3025 | 0.3158 | 0.004 | 0.012 | 4.49 |
| Example 9 | CE-2/SG2 | 100% | 0.3022 | 0.3142 | 0.007 | 0.013 | 4.70 |

Figure 19:
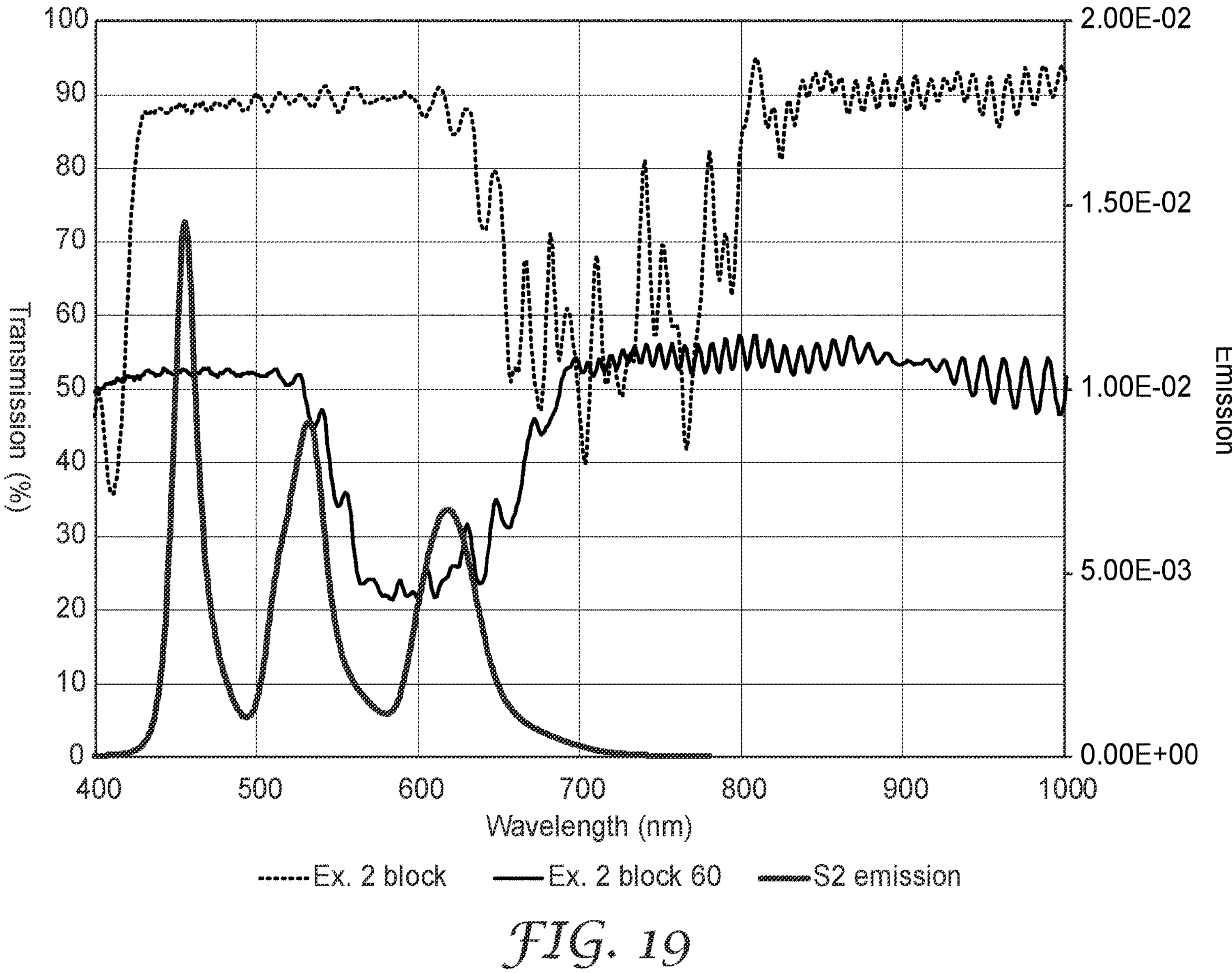
FIG. 19 is a plot of the transmission spectra of reflective polarizer of Example 2 for the block polarization state at a 0 and a 60 degree inclination angle, and of the emission spectra of an OLED display.

In FIG. 19, the block transmission spectra of reflective polarizer of Example 2, which was used in the circular polarizer of Example 8, is shown for 0 and 60 degrees inclination angle. Also shown is normal incidence emission spectra for the commercial Samsung Galaxy 2 tablet. Minimal reflectivity was present at normal incidence on the OLED emission peaks. However, at higher inclination angles, the reflectivity from the interference stack swept across the red emission peak of the OLED device.

Gain for Example 8 was calculated by dividing the emission intensity for the optical stack of Example 8 by that of the optical stack of Comparative Example 2, and is shown in FIG. 20. Since the OLED emission intensity was strongest at less than 650 nm, the gain at 0 and 15 degrees did not appear to affect emissive color. However, the gain at 30, 45 and 60 degrees did add red to the emissive color at those angles. Given the diffusive character of the backplane, it was unexpected that the gain would occur substantially only where the interference band shift occurred. In other words, the backplane appeared to interact with the film in a mostly specular manner despite the diffusive character of the backplane.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A wavelength and polarization dependent partial reflector comprising an optical stack, the optical stack comprising a plurality of optical repeat units, each optical repeat unit including first and second polymer layers, wherein for wavelengths λ1<λ2<λ3, λ3 being at least 700 nm and no more than 2500 nm, the partial reflector has:

for normally incident light polarized along a first axis, a transmittance of at least 85% for each wavelength between λ1 and λ3; and for normally incident light polarized along a second axis orthogonal to the first axis, a first reflection band having:

first and second band edges comprising first and second band edge wavelengths at λ2 and λ3, respectively, a transmittance of the partial reflector generally decreasing with increasing wavelength along the first band edge and generally increasing with increasing wavelength along the second band edge, such that for each of the first and second band edge wavelengths, the transmittance is halfway between a minimum transmittance in the first reflection band and a baseline value of the transmittance defined by the transmittance in wavelength ranges adjacent to, and on opposite sides of, the first reflection band; and an average reflectance between 15% and 97%.

2. The wavelength and polarization dependent partial reflector of claim 1, wherein the first reflection band is a primary reflection band.

3. The wavelength and polarization dependent partial reflector of claim 1, wherein the average reflectance for normally incident light polarized along the second axis is between 15% and 90%.

4. The wavelength and polarization dependent partial reflector of claim 1, wherein the average reflectance for normally incident light polarized along the second axis is between 20% and 75%.

5. The wavelength and polarization dependent partial reflector of claim 1, wherein λ1 is in a range of 380 nm to 480 nm, λ2 is in a range of 600 nm to 700 nm, and λ3 is in a range of 710 nm to 1000 nm.

6. The wavelength and polarization dependent partial reflector of claim 1, wherein an f-ratio of the optical repeat units, or 1 minus the f-ratio, is in a range of 0.06 to 0.4.

7. The wavelength and polarization dependent partial reflector of claim 1, wherein an f-ratio of the optical repeat units is in a range of 0.4 to 0.6.

8. The wavelength and polarization dependent partial reflector of claim 1, wherein a total number of optical repeat units in the optical stack is in a range of 35 to 160.

9. The wavelength and polarization dependent partial reflector of claim 1, wherein a refractive index difference between the first and second polymer layers along the second axis is $\Delta nx$, a refractive index difference between the first and second polymer layers along the first axis is $\Delta ny$, $|\Delta nx|$ being at least 0.1 and $|\Delta ny|$ being no more than 0.04.

10. The wavelength and polarization dependent partial reflector of claim 1, wherein for refractive indices along the second axis, the optical repeat units have a smallest optical thickness T1 proximate a first side of the optical stack and a largest optical thickness T2 proximate an opposite second side of the optical stack, $(T2-T1)/(T2+T1)$ being in a range of 0.05 to 0.2, T2 being at least 300 nm.

11. The wavelength and polarization dependent partial reflector of claim 10, wherein T2 is at least 350 nm and no more than 1250 nm.

12. The wavelength and polarization dependent partial reflector of claim 1, wherein the optical repeat units have a range of optical thicknesses such that $(\lambda 3-\lambda 2)/(\lambda 3+\lambda 2)$ is at least 0.03 and no more than 0.25.

13. The wavelength and polarization dependent partial reflector of claim 12, wherein the range of optical thicknesses is such that $(\lambda 3-\lambda 2)/(\lambda 3+\lambda 2)$ is at least 0.05.

14. The wavelength and polarization dependent partial reflector of claim 12, wherein the range of optical thicknesses is such that $(\lambda 3-\lambda 2)/(\lambda 3+\lambda 2)$ is no more than 0.2.

15. A circular polarizer comprising:

a linear absorbing polarizer;

a retarder, and the wavelength and polarization dependent partial reflector of claim 1 disposed between the linear absorbing polarizer and the retarder.

16. A display comprising:

an organic light emitting diode display panel having an emission spectra comprising first, second and third peak emission wavelengths $\lambda a$, $\lambda a$ and $\lambda b$ satisfying $\lambda a<\lambda b<\lambda c$; and the circular polarizer of claim 15 disposed proximate the display panel, wherein $\lambda 3>\lambda c$ and $\frac{1}{2}(\lambda b+\lambda c)<\lambda 2$.

17. The display of claim 16, wherein $\lambda 1<\lambda a$.

18. The display of claim 16, wherein the display has a $\Delta u'v'$ color shift at a view angle of 45 degrees that is no more than 0.8 times that of an otherwise equivalent display having an otherwise equivalent circular polarizer not including the wavelength and polarization dependent partial reflector.

* * * * *